(12) United States Patent
Suzuki

(10) Patent No.: US 6,400,444 B2
(45) Date of Patent: *Jun. 4, 2002

(54) EXPOSURE APPARATUS AND DEVICE PRODUCING METHOD USING THE SAME

(75) Inventor: Takehiko Suzuki, Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/005,003

(22) Filed: Jan. 9, 1998

Related U.S. Application Data

(63) Continuation of application No. 08/324,702, filed on Oct. 18, 1994, now abandoned, which is a continuation-in-part of application No. 08/087,264, filed on Jul. 8, 1993, now abandoned.

(30) Foreign Application Priority Data

Jul. 9, 1992 (JP) .............................................. 4-204285

(51) Int. Cl.⁷ ........................ G03B 27/74; G03B 27/54; G03B 27/52
(52) U.S. Cl. .............................. 355/68; 355/67; 355/53
(58) Field of Search .............................. 355/53, 67, 68, 355/69, 71; 250/548

(56) References Cited

U.S. PATENT DOCUMENTS

| | | | |
|---|---|---|---|
| 3,635,142 A | 1/1972 | Ataka et al. .................... | 95/53 |
| 4,294,538 A | 10/1981 | Ban ............................ | 355/51 |
| 4,360,783 A | 11/1982 | Nagasawa et al. ........... | 328/144 |
| 4,497,013 A | 1/1985 | Ohta ........................... | 362/32 |
| 4,516,852 A | 5/1985 | Liu et al. ..................... | 356/121 |
| 4,711,567 A | 12/1987 | Tanimoto ..................... | 355/53 |
| 4,988,188 A | 1/1991 | Ohta ........................... | 353/122 |
| 5,160,962 A | 11/1992 | Miura et al. .................. | 355/53 |
| 5,227,839 A | 7/1993 | Allen .......................... | 355/53 |
| 5,291,240 A | 3/1994 | Jain ............................ | 355/53 |
| 5,298,939 A | 3/1994 | Swanson et al. .............. | 355/53 |
| 5,331,369 A | 7/1994 | Terasawa et al. ............. | 355/53 |
| 5,343,270 A * | 8/1994 | Sakakibara et al. ........... | 355/53 |
| 5,424,552 A * | 6/1995 | Tsuji et al. .................. | 250/548 |
| 5,473,410 A | 12/1995 | Nishi ........................... | 355/53 |
| 5,475,491 A | 12/1995 | Shiozawa ..................... | 355/68 |

FOREIGN PATENT DOCUMENTS

JP 2-252228 10/1990

* cited by examiner

Primary Examiner—Russell Adams
Assistant Examiner—Peter B. Kim
(74) Attorney, Agent, or Firm—Fitzpatrick, Cella, Harper & Scinto

(57) ABSTRACT

An apparatus for exposing a wafer to ultraviolet light with a constant intensity emitted from a super-high pressure mercury lamp along an exposure beam path. A shutter opens and closes the exposure beam path. When the mercury lamp cannot be turned off during non-exposure, the mercury lamp is driven to maintain the intensity of the ultraviolet light constant when the shutter is open, and the mercury lamp is driven to maintain current, voltage or power for driving the mercury lamp constant when the shutter is closed, thereby decreasing deterioration in the mercury lamp.

18 Claims, 17 Drawing Sheets

HOLD SIGNAL 42

EXPOSURE APPARATUS AND DEVICE PRODUCING METHOD USING THE SAME

This application is a continuation of application Ser. No. 08/324,702, filed Oct. 18, 1994 now abandoned, which is a continuation-in-part of application Ser. No. 08/087,264, filed Jul. 8, 1993 now abandoned.

BACKGROUND OF THE INVENTION

1. Field of the Invention

The present invention relates to an exposure apparatus and a device producing method using the exposure apparatus. Particularly, the present invention relates to a scanning exposure apparatus in which each portion of a mask pattern is projected on a corresponding portion of a substrate to be exposed by simultaneously moving the mask and the substrate relative to an exposure beam, and a method of producing a device such as a semiconductor memory, a magnetic head, a liquid crystal panel, a CCD or the like using the scanning exposure apparatus.

2. Description of the Related Art

FIG. 17 shows an illuminating optical system and a projection optical system in a reflection type projection exposure-apparatus in which a mask pattern image is transferred to a substrate coated with a photosensitive material by using ultraviolet light emitted from a super-high-pressure mercury lamp. In FIG. 17, the ultraviolet light emitted from a super-high-pressure mercury lamp 1 is passed through an optical path formed by an elliptical mirror 2, bending mirrors 4 to 6, lens 7 and a bending mirror 8 and illuminates a slit 9. The ultraviolet light is converted to a circular arc light by an opening in the slit 9, is then reflected by a mirror 10 and is divided into two portions by a half mirror 11. One of the light portions enters a light quantity monitor sensor 12 for keeping illuminance constant, and the other portion enters a shutter 13.

When the shutter 13 is open, the circular arc light is reflected by mirrors 14 and 15 and is applied to a mask 16. The light passing through the pattern of the mask 16 is reflected by a reflection type projection optical system comprising mirrors 17 to 19 and is then directed to a wafer 22.

Since the above apparatus employs an exposure system in which the mask and the wafer, which are maintained parallel, are scanned by the circular arc light at a constant speed, exposure must be kept constant by keeping the illuminance on an image plane constant during exposure. In addition, the illuminance on the image plane must be kept constant at each exposure in order to permit control of the exposure conditions at a scanning speed in the exposure process. The super-high-pressure mercury lamp must thus be maintained lighted in a stable state.

In order to obtain stable illuminance (luminance) after the super-high-pressure mercury lamp is lighted (started), the vapor pressure of mercury in the lamp must be stabilized from the viewpoint of the structural properties thereof. In the exposure apparatus, several tens of minutes after starting are required for stabilizing the lamp. In addition, although a high voltage must be applied to the lamp at the start, if the power source of the exposure apparatus is turned on, the super-high-pressure lamp can be lighted only in a state wherein the power supplied to the exposure apparatus is off because an error is produced in the exposure apparatus due to the discharge noise caused by the high voltage applied to the super-high-pressure mercury lamp. Namely, the super-high-pressure mercury lamp must be constantly lighted in a state wherein the exposure apparatus is operated, and it is necessary and indispensable that the illuminance is kept constant during a repeated exposure operation.

As described above, in the exposure apparatus, since the super-high-pressure mercury lamp is continuously constantly lighted, the optical parts nearer the super-high-pressure mercury lamp than the shutter are continuously exposed to the strong ultraviolet light. The surface of each of the mirrors and lenses serving as the optical parts is coated with a multilayer film for controlling the reflectance or transmittance. There are thus problems that the film is deteriorated due to irradiation with the ultraviolet light, and that the reflectance or transmittance is decreased due to the deposition of a gas floating in air above the film surface, which is caused by strong ultraviolet light.

In the exposure apparatus, a feedback loop for controlling the electric power supplied to the super-high-pressure mercury lamp 1 so as to keep the quantity of light entering the light quantity monitor sensor 12 constant during the repeated exposure operation, comprises a light quantity monitor sensor 12, a super-high-pressure mercury lamp 1 and a lighting device (driving device) (not shown) for the mercury lamp 1, whereby the illuminance on an image plane (mask surface) can be kept constant. Further, since the emission efficiency of the super-high-pressure mercury lamp 1 gradually deteriorates with lighting time, the deterioration is compensated for by increasing power supply. In this feedback loop, the power supply is thus continuously increased in view of a long-term operation. This lighting method is referred to as a "constant illuminance lighting method".

If constant illuminance lighting is performed during both exposure and non-exposure, an electrode deteriorates, and the transmittance deteriorates due to the adhesion of foreign materials to the tube surface of the mercury lamp, which is caused by an increase in the internal temperature, thereby causing a problem that the performance of the super-high-pressure mercury lamp 1 deteriorates.

SUMMARY OF THE INVENTION

Accordingly, an object of the present invention is to provide an exposure apparatus that reduces deterioration in a light source and an optical system, and a method of producing a device such as a semiconductor memory, a liquid crystal panel, a magnetic head, a CCD or the like using the exposure apparatus.

In order to achieve the object, an exposure apparatus in a first preferred embodiment comprises a light source for supplying an exposure beam along an exposure path, a shutter for opening and closing the exposure beam path, and driving means for driving the light source to maintain the intensity of the exposure beam substantially constant when the exposure beam path is open, and to maintain current for driving the light source substantially constant when the path is closed.

In order to achieve the object, an exposure apparatus in a second preferred embodiment comprises a light source for supplying an exposure beam along an exposure beam path, a shutter for opening and closing the exposure beam path, and driving means for driving the light source to maintain the intensity of the exposure beam substantially constant when the path is open, and to maintain voltage for driving the light source substantially constant when the path is closed.

In order to achieve the object, an exposure apparatus in a third preferred embodiment comprises a light source for supplying an exposure beam along an exposure beam path, a shutter for opening and closing he exposure beam path, and driving means for driving the light source to maintain the intensity of the exposure beam substantially constant when the path is open, and to maintain electric power for driving the light source substantially constant when the path is closed.

In order to achieve the object, an exposure apparatus in a fourth preferred embodiment comprises a light source for supplying an exposure beam along an exposure beam path, an optical system for receiving the exposure beam, a first shutter provided on a downstream side of the optical system in the exposure beam path, for opening and closing the exposure beam path, and a second shutter provided on an upstream side of the optical system in the exposure beam path, for opening and closing the exposure beam path. The second shutter is opened before the first shutter is opened and closed after the first shutter is closed.

In order to achieve the object, a device producing method in one preferred embodiment comprises the steps of emitting an exposure beam from a light source along an exposure beam path, controlling incidence of the exposure beam on a substrate by opening and closing the exposure beam path, printing a device pattern on the substrate by exposing the substrate to the exposure beam when the path is open, and driving the light source to maintain intensity of the exposure beam substantially constant when the path is open, and to maintain the light source current for driving the light source substantially constant when the path is closed.

In order to achieve the object, a device producing method in another preferred embodiment comprises the steps of emitting an exposure beam from a light source along an exposure beam path, controlling incidence of the exposure beam on a substrate by opening and closing the exposure beam path, printing a device pattern on the substrate by exposing the substrate to the exposure beam when the path is open, driving the light source is driven to maintain intensity of the exposure beam substantially constant when the path is open, and to maintain voltage for driving the light source substantially constant when the path is closed.

In order to achieve the object, a device producing method in yet another preferred embodiment comprises the steps of emitting an exposure beam from a light source along an exposure beam path, controlling incidence of the exposure on a substrate by opening and closing the exposure beam path, printing a device pattern on the substrate by exposing the substrate to the exposure beam when the path is open, driving the light source to maintain intensity of the exposure beam substantially constant when the path is open, and to maintain electric power for driving the light source substantially constant when the path is closed.

In order to achieve the object, a device producing method in still another preferred embodiment comprises the steps of emitting an exposure beam from a light source along an exposure beam path, controlling incidence of the exposure beam on a substrate by opening and closing the exposure beam path, providing a first shutter for opening and closing the exposure beam path on the downstream side of the optical system and a second shutter for opening and closing the exposure beam path upstream of the optical system, the shutter on the upstream side being opened before the shutter on the downstream side is opened, and closed after the shutter on the downstream side is closed, and printing a device pattern on the substrate by exposing the substrate to the exposure beam when the exposure beam path is open.

BRIEF DESCRIPTION OF THE DRAWINGS

Like reference numerals have been used throughout the figures for like or corresponding elements.

DESCRIPTION OF THE PREFERRED EMBODIMENTS

Figure 1:
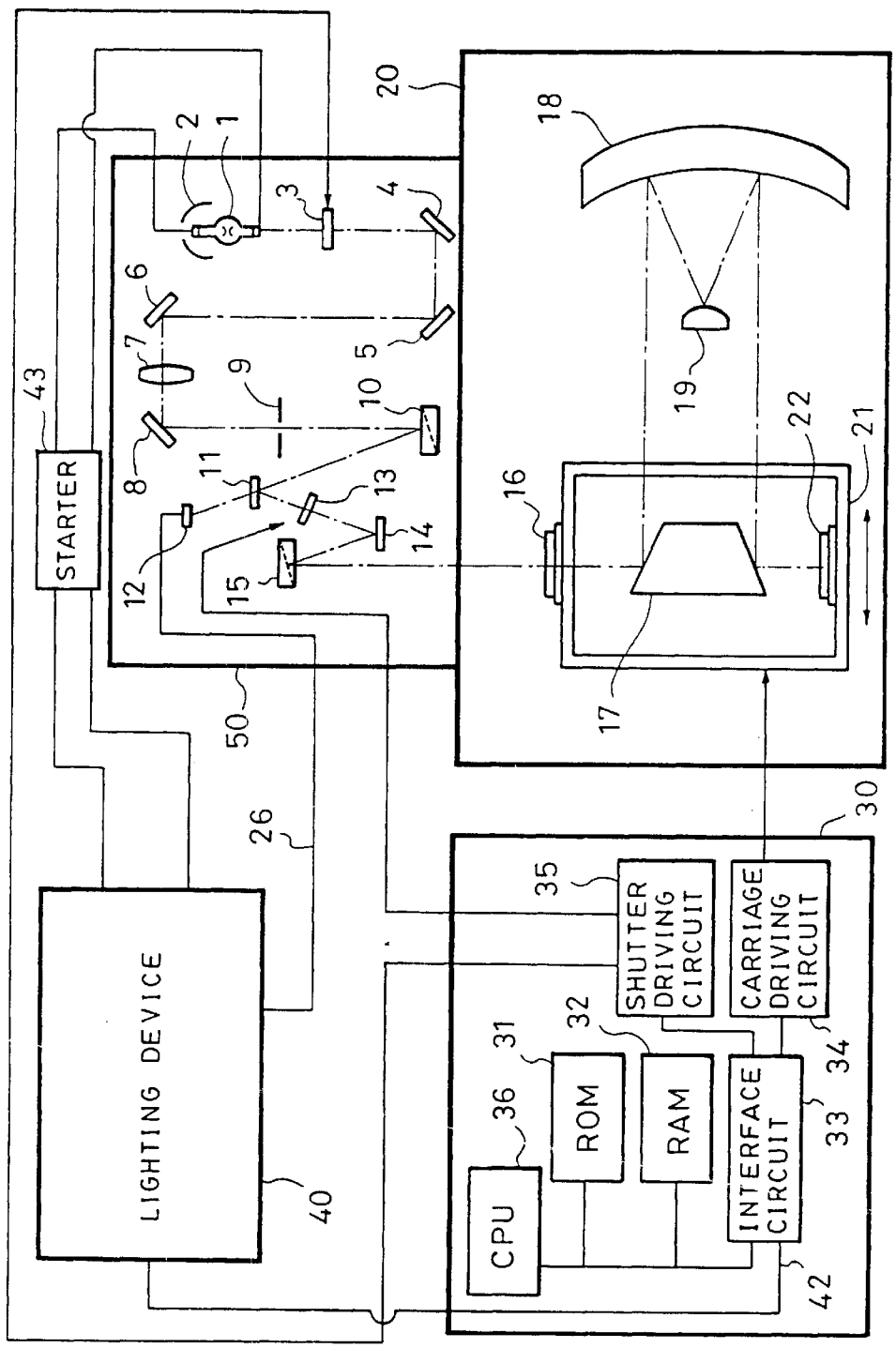
FIG. 1 is a diagram showing the construction of a reflection type projection exposure apparatus in accordance with first, second and third embodiments of the present invention.

In one embodiment of the present invention, a second shutter is disposed at a portion as near a super-high pressure mercury lamp of an illuminating optical system as possible apart from a main shutter that is disposed far away from the light source. The second shutter is closed until the exposure operation of an exposure apparatus is started so that strong ultraviolet light is not continuously applied to the optical parts disposed in the illuminating optical system, thereby preventing deterioration in the film of each optical part and the adhesion of foreign materials caused by deposition of gases. On the other hand, the super-high-pressure mercury lamp is lighted with constant illuminance (constant luminance) on the basis of the output from a light quantity monitor sensor for detecting the quantity of illuminating light. In this embodiment, if the light quantity monitor sensor is positioned behind the second shutter, since no light enters the light quantity monitor sensor when the second shutter is closed, not only could the constant illuminance control of the super-high-pressure mercury lamp not be made, but also the power supply is increased to an upper limit, thereby causing deterioration in the super-high-pressure mercury lamp. In this embodiment, therefore, although the constant illuminance lighting mode is performed when the second shutter is open, the lighting mode is switched to a constant current mode, constant power mode, or constant voltage mode when the second shutter is closed. This prevents a supply of excessive power to the illumination light source.

If there is a great difference between the illuminance in the constant current, constant power or constant voltage lighting mode and the illuminance in the constant illuminance lighting mode, when the constant current, constant power or constant voltage lighting state is switched to the constant illuminance lighting state, much time is required for stabilizing the illuminance. When exposure is immediately performed, unevenness of exposure thus occurs. Conversely, when exposure is performed after the illuminance becomes stable, throughput is decreased. In this embodiment, when the second shutter is closed, constant current or constant voltage lighting is controlled so that the electric power supplied immediately before the second shutter is closed is maintained.

Furthermore, when the state of the second shutter is changed from the closed state to the open state, the lighting mode of the super-high-pressure mercury lamp is switched from the constant power mode, constant current mode or constant voltage mode to the constant illuminance mode. At this time, since the emission efficiency of the super-high-pressure mercury lamp in the constant power, constant current or constant voltage state deteriorates with time, the electric power, current or voltage in the constant power state, constant current state or constant voltage holding state is increased. When there is a large power difference, current difference or voltage difference, much time is required for stabilizing illuminance. During the sequential operation of the apparatus, the constant power state, constant current state or constant voltage state must be switched to the constant illuminance state before an exposure operation is started. At this time, since unevenness of exposure occurs in an unstable illuminance state, time is required for stabilizing illuminance, thereby decreasing throughput. This embodiment is thus provided with an automatic maintenance function to automatically switch the constant power mode, constant current mode or constant voltage mode to the constant illuminance lighting mode and renew the maintained value of power, current or voltage when the apparatus is idle, whereby the above problem can be solved. Namely, a function to monitor the closing time of the second shutter is provided so as to automatically open the second shutter during idling in the apparatus sequence when the closing time reaches a set time, and renew the maintained power, current or voltage, thereby decreasing the power difference, current difference or voltage difference produced when. the constant power, constant current or constant voltage lighting is switched to the constant illuminance lighting. This decreases the stabilization time in response to the switching, and thus prevents a decrease in throughput.

In another embodiment of the present invention, the light quantity monitor sensor is provided between the second shutter and the super-high-pressure mercury lamp, or a second light quantity monitor sensor is provided therebetween so that the output from the light quantity monitor sensor can be supplied to the lighting device during the closing of the second shutter.

In still another embodiment of the present invention, the lighting device for lighting the illumination light source is designed so that the constant illuminance lighting mode and the constant power mode, constant current mode or constant voltage (lighting) mode can be switched, and the electric power or current at the time of switching from the constant illuminance lighting mode to the constant power lighting mode or constant current lighting mode is maintained during the constant power lighting mode, constant current lighting mode or constant voltage lighting mode. For example, in a scanning exposure apparatus, although the constant illuminance lighting must be performed for maintaining constant illuminance during exposure, no problem occurs during an operation other than the exposure operation and the operation of measuring illuminance even if illuminance changes to some extent. During this operation, therefore, constant power, constant current or constant voltage maintained at a value at the end of exposure or of the operation of measuring illuminance is supplied to the super-high-pressure mercury lamp to light the mercury lamp. The time interval of an increase in supply power, supply voltage or supply current is thus increased, and deterioration in the super-high-pressure mercury lamp is decreased, thereby increasing the life of the lamp, as compared with the case when the constant illuminance lighting is continuously made.

FIG. 1 is a schematic diagram of a reflection type projection exposure apparatus for producing a device in accordance with an embodiment of the present invention. In FIG. 1, reference numeral 50 denotes an illumination system having a light source for the exposure apparatus and an illumination optical system; and reference numeral 20, a body having a mechanism for transferring a mask device pattern to a wafer, an alignment mechanism (not shown) and a projection optical system comprising parts 17 to 19. Reference numeral 30 denotes a control box containing a CPU for controlling the sequential operation of the exposure apparatus; and reference numeral 40, a lighting device for lighting a super-high-pressure mercury lamp 1 serving as a light source for the exposure apparatus and controlling electric power during lighting. Signal transmission and power supply to each of the units are performed through cables.

In the illumination system 50, reference numeral 1 denotes the super-high pressure mercury lamp as a light source; and reference numeral 2, a spherical mirror for converging the light (including ultraviolet rays) emitted from the mercury lamp 1 in the direction of the set optical path shown by a one-dot chain line. Reference numeral 3 denotes a second shutter provided apart from a first shutter 13 to protect the optical parts.

In the projection exposure apparatus, the second shutter 3 is open during the exposure operation, and the light emitted from by the mercury lamp 1 and reflected by the spherical mirror 2 travels along the optical path shown by the one-dot chain lines, passes through mirrors 4, 5 and 6, a condenser lens 7 and a mirror 8 and enters a slit 9. Effective light used for projection exposure is cut off by the slit 9 to produce slit (for example, circular arc) light. The slit light is reflected by a concave mirror 10 and divided by a half mirror 11 into a little portion of the light which enters a light quantity monitor sensor 12 used for keeping illuminance constant, and a greater portion of the light which enters the first shutter 13 serving as an exposure control shutter of this apparatus. The shutter 13 opens the optical path during exposure in the operation sequence of the apparatus so that the slit light is reflected by a mirror 14 and a concave mirror 15, and is directed to a mask 16. The mask 16 and a wafer 22 are integrally supported by a carriage 21. When the mask 16 and the wafer 22 are simultaneously moved, the position of the slit light applied to the mask 16 relative to the mask 16 and the wafer 22 is also moved, and the whole device pattern image of the mask 16 is consequently transferred to the whole surface of the wafer 22. The wafer 22 is then treated to produce a device. Examples of devices include a semiconductor memory, a CCD, a magnetic head, a liquid crystal panel and the like.

The control box 30 comprises an ROM 31 for storing an operation sequence program for the whole apparatus, a central processing unit (CPU) 36 for computing the operation sequence program and processing the sequence, an RAM 32 for storing processed data, an interface circuit 33 for inputting and outputting a signal to an actuator (not shown) for each of the sections of the apparatus, a carriage driving circuit 34 for driving an actuator (not shown) so as to move the carriage 21, and a shutter driving circuit 35 for driving an actuator (not shown) so as to open and close the exposure control shutter 13 and the second shutter 3.

When the lighting device 40 is activated, the mercury lamp 1 is lighted (started) through a starter 43 for applying a high voltage thereto. The lighting device 40 has two lighting modes including a mode for lighting the mercury lamp 1 with a constant current and another mode for lighting with a constant illuminance (constant luminance). The mercury lamp 1 is in the constant current mode immediately after lighting (starting).

In an exposure apparatus in which each of the mask 16 and the wafer 22 is scanned at a constant speed, the mercury lamp 1 must be used in the constant illuminance mode during the exposure operation. The lighting mode must be switched to the constant illumination mode, for example, by a manual operation, for setting a reference value of illuminance in the constant illuminance mode. During switching, since no light enters the light quantity monitor sensor 12 if the second shutter 3 is closed, the second shutter must be opened. Before the lighting mode is switched to the constant illuminance mode, the actuator (not shown) is operated by operating a switch (not shown) provided on the body 20 through the shutter driving circuit 35 using a special sequence in the sequence list stored in the ROM 31 through the interface circuit 33 so as to open the second shutter. In the open state, the mode of the mercury lamp 1 is switched to the constant illumination mode by operating a console panel of the lighting device 40. In this state, an illumination meter is set on the apparatus, and an illumination reference value is set by operating a dial mounted on the console panel of the lighting device 40.

In this embodiment, although the mercury lamp 1 lighted in the constant illuminance mode during the exposure sequential operation, the second shutter 3 is closed for protecting the optical parts in the illumination optical system in a sequential operation other than the exposure sequential operation and the operation of measuring illuminance. At this time, if the second shutter 3 is closed in the constant illumination mode of the lighting device 40, the internal circuit of the lighting device 40 increases electric power supplied to the mercury lamp 1 to a limit value due to a decrease in the quantity of light detected by the light quantity monitor sensor 12, though the output of the light quantity monitor sensor 12 is constant during constant illumination control in the exposure sequential operation or the like. In the exposure apparatus, therefore, this problem is solved by switching the lighting control modes of the lighting device 40.

Figure 2:
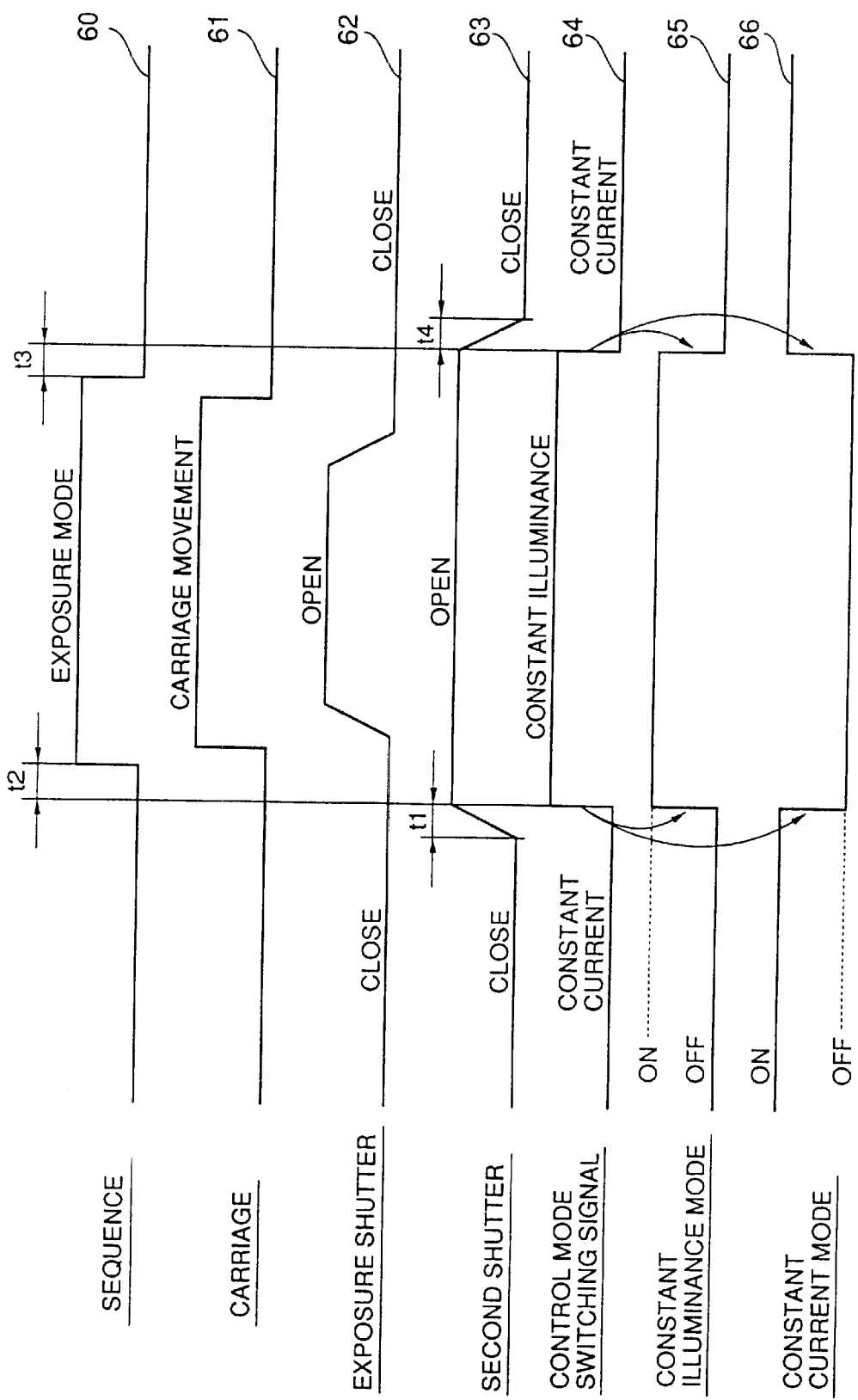
FIG. 2 is a timing chart showing the operation timing of each section of an exposure apparatus in accordance with the first embodiment of the present invention.

FIG. 2 is a diagram showing the timing of switching between opening and closing of the exposure shutter 13 and the second shutter 3 before and after the exposure sequence in the operation sequence of the apparatus, and the timing of switching between the constant illumination mode and the constant current mode in conjunction with the opening and closing operation of the shutters. In FIG. 2, reference numeral 60 denotes an exposure sequence; reference numeral 61, carriage movement for scanning exposure; reference numeral 62, the timing of opening and closing of the exposure shutter 13; and reference numeral 63, the timing of opening and closing the second shutter 3. Reference numeral 64 denotes a timing signal of switching between the constant illumination mode and the constant current mode, and corresponding to a control mode switching signal 42 input to the lighting device 40 from the interface circuit 33 shown in FIG. 1. Reference numeral 65 denotes the operation timing of the constant illuminance mode, and reference numeral 66, the operation timing of the constant current mode.

In the state shown on the left of the timing chart 63 in FIG. 2 wherein the second shutter 3 is closed, the constant current mode of the mercury lamp 1 is turned on, as shown on the left of the timing chart 66 in the drawing, and the lighting of the mercury lamp 1 is controlled independently of the signal of the light quantity monitor sensor 12. The second shutter 3 is opened before the exposure sequence is started, as shown in the timing chart 63. The control mode switching signal 42 shown in the timing chart 66 is changed after the second shutter 3 is completely opened (after t1 seconds), and a signal indicating the change in the state of the second shutter 3 is transmitted to the lighting device 40 shown in FIG. 1. When the lighting device 40 receives this signal, the control mode is automatically changed from the constant current mode to the constant illuminance mode.

In the constant illuminance mode, since illuminance is sometimes different from that in the constant current mode, the exposure operation is started after elapse of time t2 sufficient to stabilize the illuminance in a constant state. In the exposure operation, the carriage 21 shown in FIG. 1 is first moved to a position on the right of the drawing where no light is applied to the mask and wafer. The exposure shutter 13 is then opened before the carriage 21 is moved to the left of the drawing, as shown by the timing chart 62, and the mask 16 and the wafer 22 are scanned and exposed at a constant speed by movement of the carriage 21 to the left of the drawing from the right thereof at a constant speed. After the whole surfaces of the mask 16 and the wafer 22 are exposed, the exposure shutter 13 is closed. The control mode switching signal 42 is then changed after the completion of the exposure sequence (after t3 seconds) so that the lighting control mode is switched again to the constant current mode, and the second shutter 3 is then closed t4 seconds after. Since the illumination light is cut off by the second shutter 3 until the exposure sequence is started, the optical parts in the illumination system and projection optical system are protected. The above operation sequence is then repeated.

When the second shutter 3 is closed, the super-high pressure mercury lamp 1 may be lighted with a constant power or constant voltage.

The lighting efficiency of the super-high pressure mercury lamp 1 decreases with lighting time. Namely, if the supply current, supply voltage or supply power is constant, the illuminance (luminance) decreases with lighting time. When the super-high pressure mercury lamp 1 is lighted with a constant current, constant voltage or constant power while the set value of current, voltage or power is fixed, a situation thus sometimes occurs in which illuminance on constant current lighting, constant voltage lighting or constant power lighting is greatly different from that on constant illuminance lighting. If the illuminance on constant current lighting, constant voltage lighting or constant power lighting is greatly different from that on constant illuminance lighting, the constant current lighting state, constant voltage lighting state or constant power lighting state is switched to the constant illuminance lighting state, much time is required for stabilizing illuminance. If exposure is immediately started, unevenness of exposure occurs. Conversely, if exposure is started after the illuminance is stabilized, throughput is decreased.

The second embodiment is designed for preventing the occurrence of unevenness of exposure and a decrease in throughput. In an apparatus in accordance with the second embodiment, the lighting device 40 of the first embodiment shown in FIG. 1 is improved. The lighting device 40 of the second embodiment has three lighting modes including a mode of lighting the mercury lamp 1 with a constant current, a constant illuminance mode of keeping illuminance constant, and a mode of holding the power supplied immediately after the second shutter 3 is closed.

When the lighting device 40 is lighted, the mercury lamp 1 is lighted (started) through the starter 43 for applying a high voltage thereto. The mercury lamp 1 is in the constant current mode immediately after being lighted (started). In this apparatus, the mercury lamp 1 must be used in the constant illuminance mode during the exposure operation. It is therefore necessary that the lighting mode is once switched to the constant illuminance mode by a manual operation for setting a reference value of illuminance. At this time, if the second shutter 3 is closed, no light enters the light quantity monitor sensor 12. Thus, the second shutter 3 must be opened. A switch (not shown) provided on the apparatus body is operated before the lighting mode is switched to the constant illuminance mode so that an actuator (not shown) is operated by the shutter driving circuit using a special sequence in the sequence list stored in the ROM 31 through the interface circuit 33 to open the second shutter 3. In this state, an illuminance meter is set on the apparatus, and the set value of illuminance is set by operating a dial mounted on a console panel of the lighting device 40.

In this embodiment, the mercury lamp 1 is lighted in the constant illuminance mode during the exposure sequential operation, and the second shutter 3 is closed for protecting the optical parts in the illumination system in an operational sequence other than in the exposure sequential operation and the operation of measuring illuminance. At this time, if the second shutter 3 is closed in the state where the lighting device 40 is in the constant illuminance mode, the internal circuit of the lighting device increases the power supplied to the mercury lamp 1 to a limit value due to a decrease in quantity of the light detected by the light quantity monitor sensor 12, though the output of the light quantity is constant during constant illuminance control. In the apparatus of this embodiment, the lighting control mode of the lighting device 40 is switched.

Figure 3:
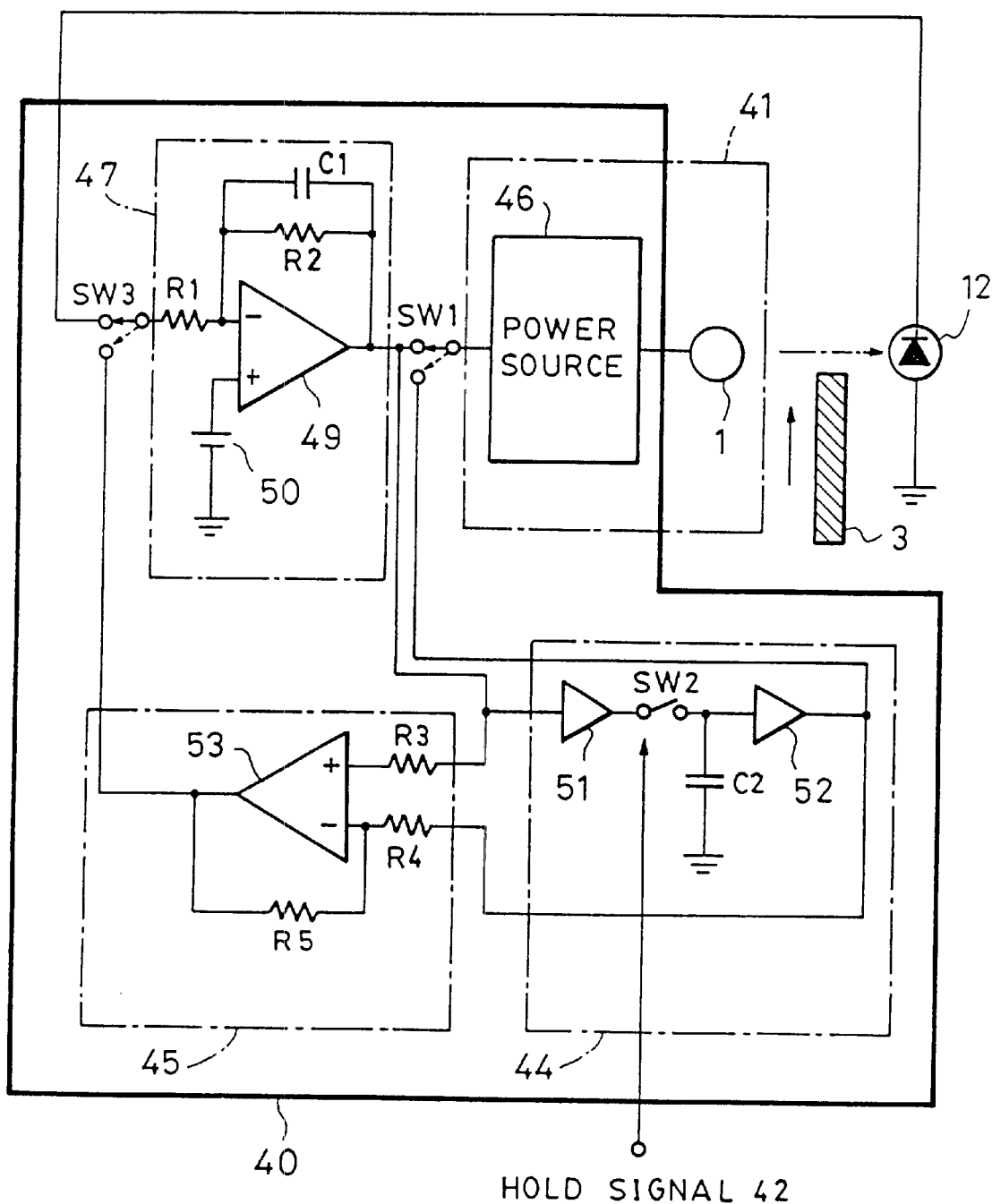
FIG. 3 is a diagram showing the circuit of a principal portion of a lighting device in accordance with the second embodiment for explaining the operation of maintaining electric power.

FIG. 3 is a diagram illustrating the circuit used in this embodiment. The circuit comprises a controlled section 41 comprising a power source 46 and a light source 1, a detector 12 comprising a photodiode for detecting the optical output from a super-high pressure mercury lamp, which is the output of the controlled section 41, a first error amplifier 47 for comparing the detected output signal of the detector 12 with a reference voltage of a reference power source to output an error signal, a holding circuit 44, and a second error amplifier 45. Reference numeral 49 denotes an operational amplifier; and reference numeral 50, the reference power source. Reference numerals 51 and 52 each denote a buffer amplifier, and reference numeral 53 denotes an operational amplifier. Reference numerals R1 to R5 each denote a resistor; reference numerals C1 and C2, a capacitor; and reference numerals SW1 and SW3, a change-over switch. Reference numeral SW2 denotes a sampling switch.

The first error amplifier 47 comprises the operational amplifier 49, the reference power source 50, the resistors R1 and R2 and the capacitor C1. The second error amplifier 45 comprises the operational amplifier 53 and the resistors R3 to R5. The holding circuit 44 comprises the buffer amplifiers 51 and 52, the capacitor C2 and the sampling switch SW2. The sampling switch SW2 is operated by a hold signal. Each of the change-over switches SW1 and SW3 is controlled in conjunction with the opening and closing of the second shutter 3. When the light emitted from the super-high pressure mercury lamp 1 is cut off by closing the second shutter 3, the hold signal is supplied to the holding circuit 44, and each of the change-over switches SW1 and SW3 is controlled so that the light emitted from the super-high pressure mercury lamp 1 is intercepted by the second shutter 3 after the switches SW1, SW3 are switched from a position shown by a solid line with an arrow to a position shown by a dotted line with an arrow. Conversely, when the light emitted from the super-high pressure mercury lamp 1 is sent by opening the second shutter 3, each of the change-over switches SWI and SW3 is controlled so as to be switched from the position shown by a dotted line with an arrow to the position shown by a solid line with an arrow after the second shutter 3 is opened. This control function can easily be realized by various logic circuits, microprocessors or the like.

The state wherein each of the change-over switches SW1 and SW3 is switched to the position shown by the solid line with the arrow while the second shutter 3 is opened is the state wherein constant illuminance control of the super-high pressure mercury lamp 1 is carried out by a feedback loop. This state corresponds to the state wherein the feedback loop is cut when the light emitted from the super-high pressure mercury lamp 1 is cut off by closing the second shutter 3. In this state, since each of the change-over switches SW1 and SW3 is switched to the position shown by the dotted line with the arrow, the signal output from the first error amplifier 47 is input to the second error amplifier 45, and is compared with the hold output signal from the holding circuit 44 as a reference value to output an error output signal to the first error amplifier 47. The output signal from the first error amplifier 47 is thus maintained at a value specified by the hold output signal of the holding circuit 44.

Figure 4:
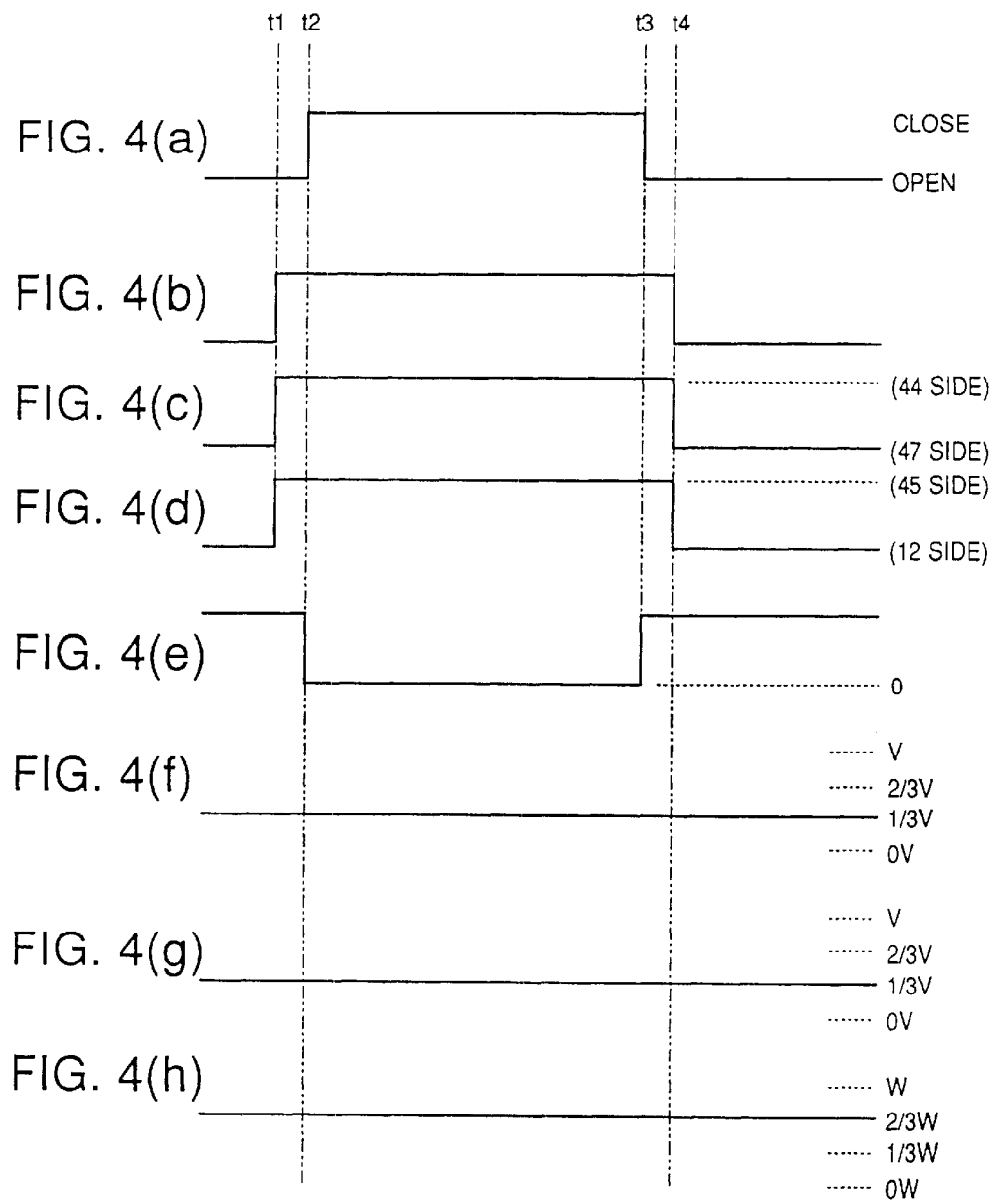
FIGS. 4(a) to 4(h) are diagrams explaining the operation of maintaining electric power when a mode is switched between constant illuminance and power holding operation modes by opening and closing a second shutter in accordance with the second embodiment.

FIGS. 4(*a*) to 4(*h*) are diagrams explaining the operation of this embodiment. FIG. 4(*a*) denotes the opening and closing of the second shutter 3; FIG. 4(*b*), the hold signal; FIG. 4(*c*), the switching operation of the change-over switch SW1; FIG. 4(*d*), the switching operation of the change-over switch SW3; FIG. 4(*e*), the detected output signal of the detector 12; FIG. 4(*f*), the output signal of the first error amplifier 47; FIG. 4(*g*), the input signal of the power source 46; and FIG. 4(*h*), the electric power supplied to the light source 1.

The sampling switch SW2 is operated by the holding signal at time t1 so that the output signal from the first error amplifier 47 is held in the capacitor C1. The change-over switch SW1 is switched from the side of the first error amplifier 47 to the side of the holding circuit 44, as shown by FIG. 4(c). The change-over switch SW3 is switched from the side of the detector 12 to the side of the second error amplifier 45, as shown by FIG. 4(d).

The light emitted from the super-high pressure mercury lamp 1 is intercepted by closing the second shutter 3 at time t2. This makes the detected output signal of the detector 12 zero, as shown by FIG. 4(e). At this time, the output signal from the second error amplifier 45 is input to the first error amplifier 47. Since, in the second error amplifier 45, the hold output signal of the holding circuit 44 is input to the (−) terminal of the operational amplifier 53 through the resistor R4, and the output signal from the first error amplifier 47 is input to the (+) terminal of the operational amplifier 53 through the resistor R3, the output signal from the second error amplifier 45 which is input to the first error amplifier 47 is a value corresponding to the hold output signal from the holding circuit 44, and the output signal from the first error amplifier 47 is maintained at the value of the signal output immediately before the second shutter 3 is closed. Namely, for example, the output signal of (⅓) V is maintained, as shown by FIG. 4(f).

When the second shutter 3 is opened at time t3, the detected output signal from the detector 12 is a value corresponding to the intensity of the light emitted from the super-high pressure mercury lamp 1, as shown by FIG. 4(e). At this time, since each of the change-over switches SW1 and SW3 is switched to the position shown by the dotted line with the arrow, the output signal from the first error amplifier 47 is maintained in the previous state. When each of the change-over switches SW1 and SW3 is switched from the position shown by the dotted line with the arrow to the position shown by the solid line with the arrow at time t4, the output signal of the first error amplifier 47 is maintained at the value of the signal output immediately before the second shutter 3 is closed. In this case, if the luminance of the light emitted from the super-high pressure lamp 1 is constant, the output signal of the first error amplifier 47 is also constant, as shown by FIG. 4(f). Thus, the signal input to the power source is also constant, and the power supplied to the super-high pressure mercury lamp 1 is maintained at, for example, a constant value of (⅔) W.

Figure 5:
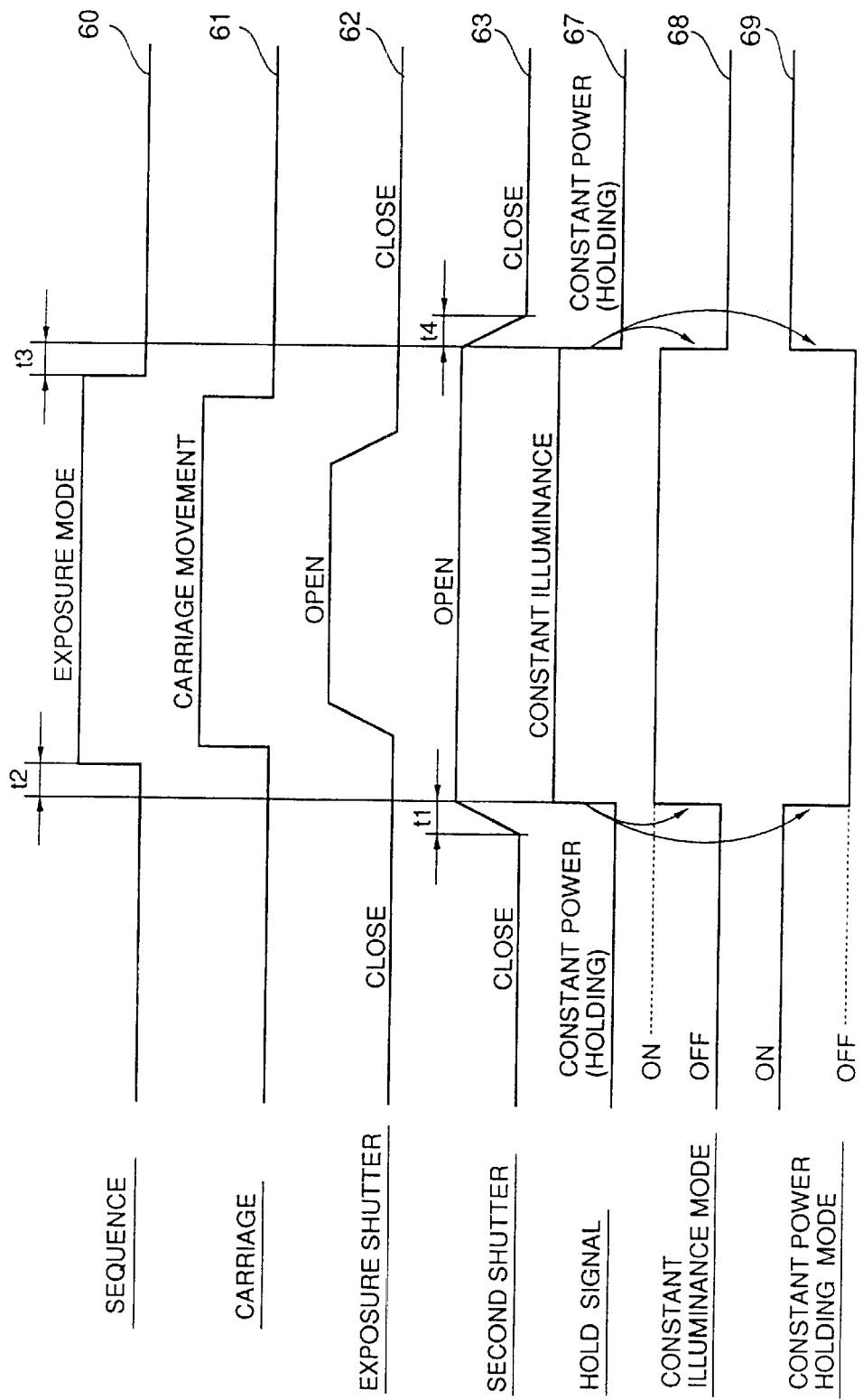
FIG. 5 is a timing chart showing an exposure sequence and the switching timing of control modes of a mercury lamp in accordance with the second embodiment.

FIG. 5 is a diagram showing the opening and closing operation of the exposure shutter 12 and the second shutter 3 before and after the exposure sequence in the operational sequence of this apparatus, and the timing of switching between the constant illuminance mode and the constant power holding mode in conjunction with the opening and closing operation. In FIG. 5, reference numeral 60 denotes the exposure sequence; reference numeral 61, the movement of the carriage 21 for scanning exposure; reference numeral 62, the timing of opening and closing of the exposure shutter 13; and reference numeral 63, the timing of opening and closing the second shutter 3. Reference numeral 67 denotes a signal which indicates the timing of switching between the constant illuminance mode and the constant power holding mode and which corresponds to the hold signal 42 shown in FIG. 1 input to the lighting device 40 from the interface circuit 33. Reference numeral 68 denotes the operation timing of the constant illuminance mode, and reference numeral 69 denotes the operation timing of the constant power holding mode.

In the state shown on the left of the timing chart 63 wherein the second shutter 3 is closed, the constant power holding mode as a control mode of the mercury lamp 1 is turned on, as shown on the left of the timing chart 69 in FIG. 5 so that lighting of the mercury lamp 1 is controlled independently of the output of the light quantity monitor sensor 12. The second shutter 3 is opened before the exposure sequence is started, as shown by the timing chart 63. The hold signal is changed after the second shutter 3 is completely opened (after t2 seconds) by the operation of an actuator, and the change in state of the second shutter 3 is transmitted to the lighting device 40 through the signal 42. When the lighting device 40 receives the signal 42, the control mode is automatically switched from the constant power holding mode to the constant illuminance mode. At the same time, the electric power supplied to the mercury lamp 1 is also changed.

Figure 6:
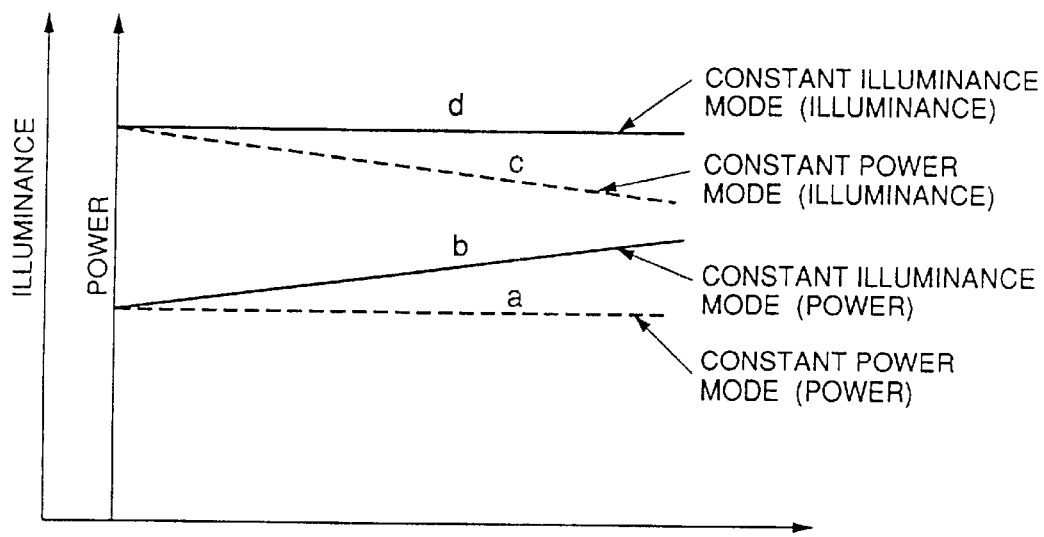
FIG. 6 is a diagram illustrating changes with time of electric power and illuminance in the constant illuminance lighting and constant power holding lighting modes.

FIG. 6 shows changes in illuminance on constant illuminance lighting and constant power holding lighting for a long time. In FIG. 6, electric power on constant power lighting is shown by broken line a, and the corresponding change in illuminance is shown by broken line c. With a constant power, the illuminance is decreased due to the gradient deterioration in the lamp efficiency during long-term lighting. On the other hand, electric power on the constant illuminance lighting is shown by solid line b, and illuminance on constant illuminance lighting is shown by solid line d. This reveals that the deterioration in the lamp efficiency is compensated for by increasing the electric power.

Figure 7:
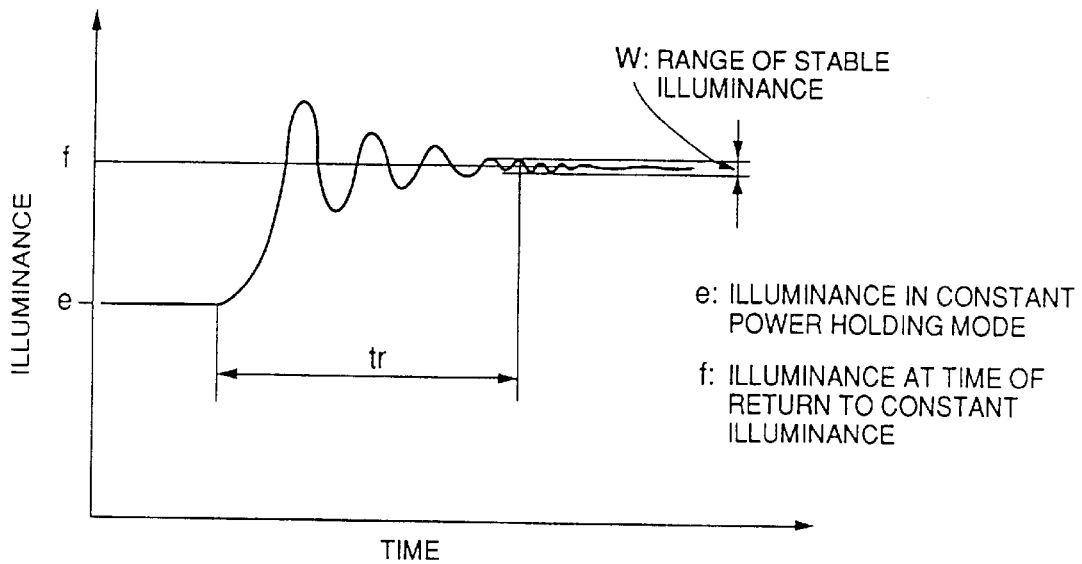
FIG. 7 is a diagram illustrating transient response when constant power holding lighting is switched to constant illuminance lighting.

FIG. 7 shows changes in illuminance at a time of return to the constant illuminance state from the constant power holding state. In FIG. 7, character e denotes illuminance in the constant power holding state; character f, illuminance after the return to constant illuminance; and character W, the range of stable illuminance. Referring to FIG. 7, a time tr is required for changing the constant power holding state to the constant illuminance stable state. The operational sequence is thus formed so that the exposure operation is started after elapse of a time t2 over the response stabilization time tr at switching.

In the exposure operation, the carriage 21 shown in FIG. 1 is first moved to the right of the drawing to a position where no light is applied to the surfaces of the mask and the wafer. The exposure control shutter 13 is then opened (OPEN) before the carriage 21 is moved to the left of the drawing, as shown in the timing chart 62. When the carriage 21 is then moved from the right to the left of the drawing at a constant speed, the mask 16 and the wafer 22 are scanned and exposed at a constant speed. After the whole surface of the wafer 22 is exposed, the shutter 13 is closed (CLOSE). The hold signal 42 is changed after the exposure sequence is completed (after time t3) so that the lighting control mode is switched again to the constant power holding mode, and the second shutter 3 is closed a time t4 after. The optical parts in the illumination system and the projection optical system are protected until the exposure sequence is started. The operation sequence is then repeated.

In the above embodiment, when the second shutter 3 is closed, the super-high pressure mercury lamp 1 may be lighted with a constant current or constant power.

The above-described time t2 must be as small as possible in order to prevent a decrease in the throughput of the apparatus. Thus, the time tr must also be as small as possible. Particularly, a problem actually occurs when a constant power is held for a long time. Namely, a problem occurs when a difference in power between the lighting modes is increased. In the embodiment below, therefore, the power difference is maintained, and is automatically compensated for when increasing to a Level which causes a problem. Namely, a function to monitor the closing time of the second shutter 3 is provided so that the second shutter 3 is automatically opened and closed during idling in the operation sequence to renew the held power when the time reaches a set time.

Figure 8:
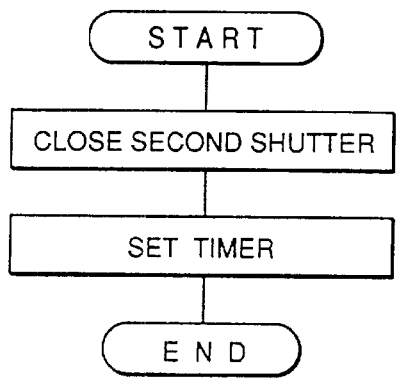
FIGS. 8 to 10 are each flowcharts illustrating the operation of the third embodiment of the present invention.
Figure 9:
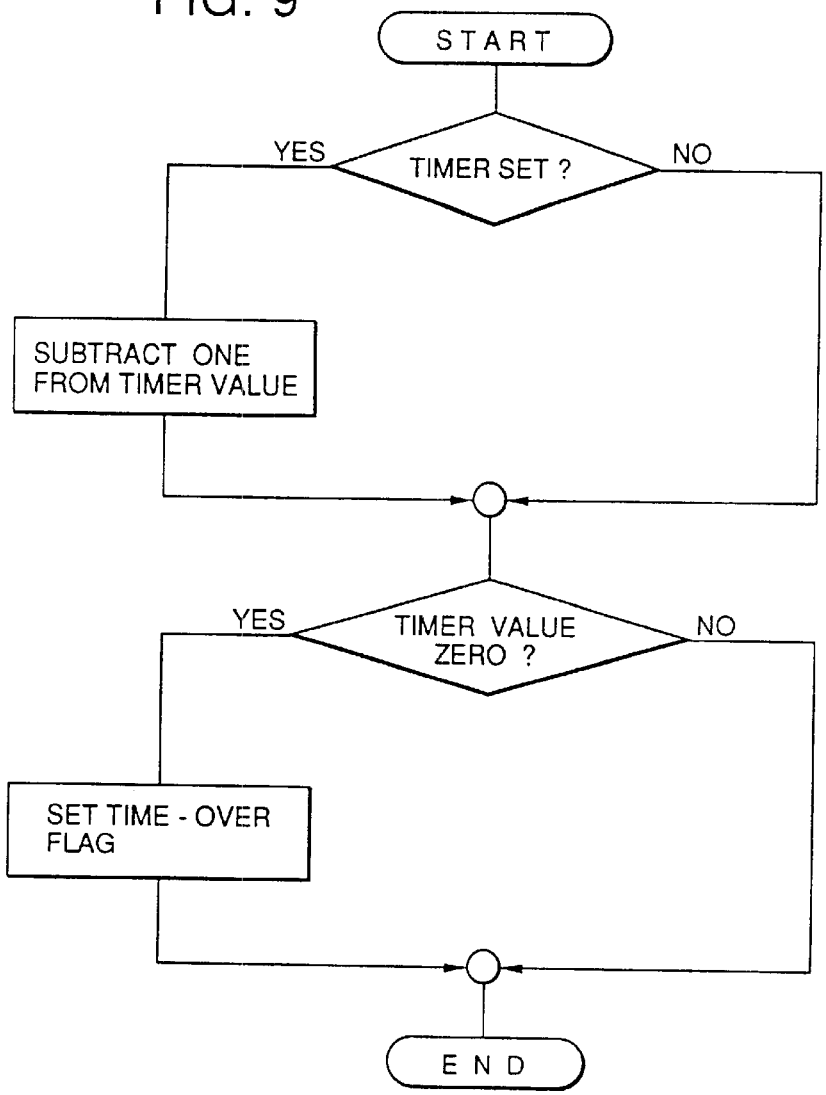
Figure 10:
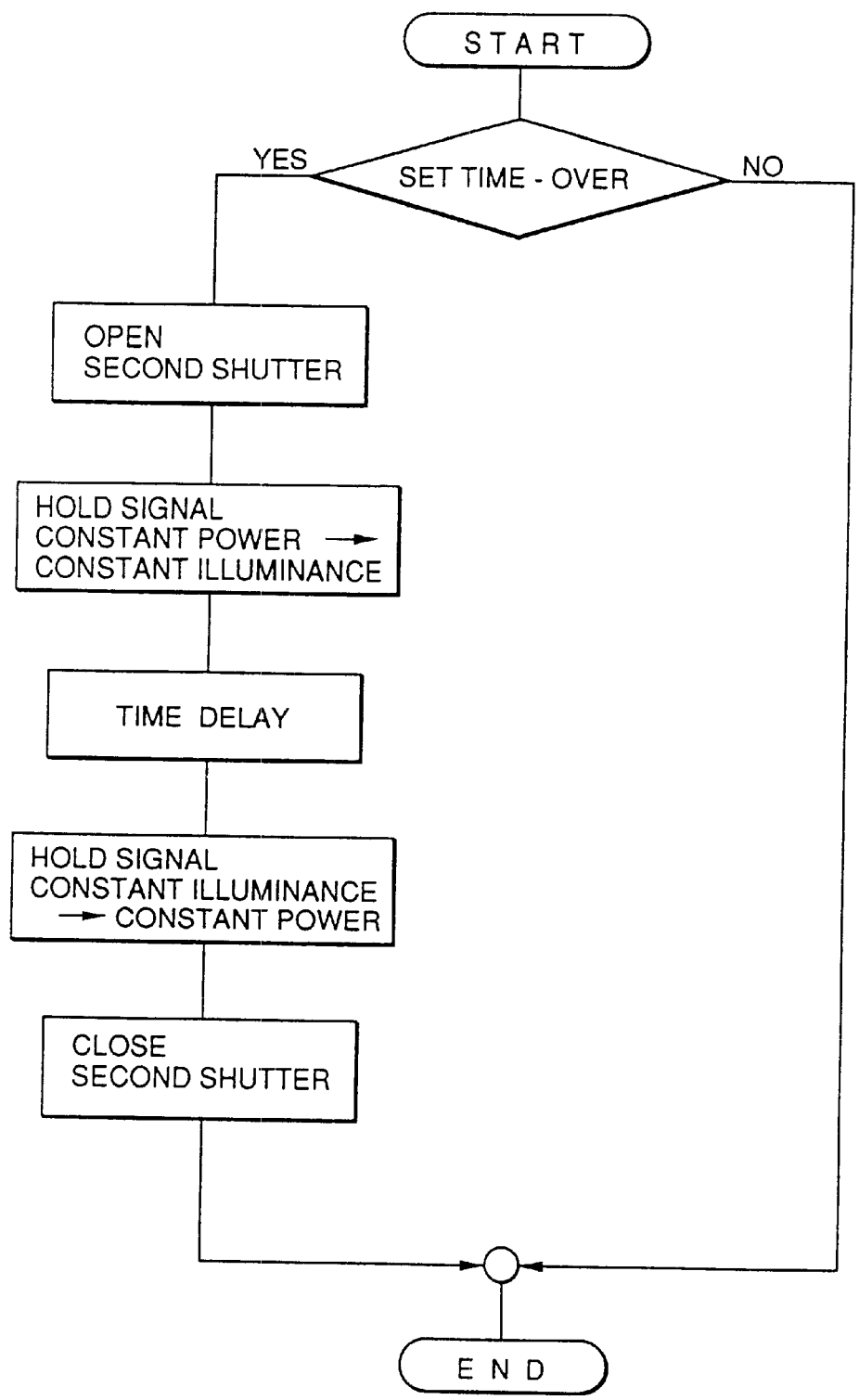

FIGS. 8 to 10 shows operation sequence in the third embodiment. In this embodiment, the operation sequence shown in FIGS. 8 to 10 is added to the exposure sequential processing of the second embodiment.

FIG. 8 shows the set timing of a timer. After the second shutter 3 is closed, the timer is set. Although various setting methods can be used, a variable set time may be input by a switch (not shown), or a set time may be input by a console (not shown).

FIG. 9 shows the processing of the timer. In the processing, a timer value is subtracted at constant time intervals in the interrupt sequence, and a flag is set when the timer value becomes zero.

FIG. 10 shows a routine provided at a position where the apparatus waits for the operation of next processing. The timer flag is checked, and if the timer value is over the set time, the second shutter 3 is opened so that the constant power mode is switched to the constant illuminance mode by the hold signal 42. After a time delay corresponding to the time the switching operation of the second shutter 3 and the lighting device 40 is completed, the constant illuminance mode is switched again to the constant power holding mode by the hold signal 42. After a time delay necessary for holding constant power, the second shutter 3 is closed. This permits an automatic decrease in the power difference and prevents an increase in the response stabilization time.

Figure 11:
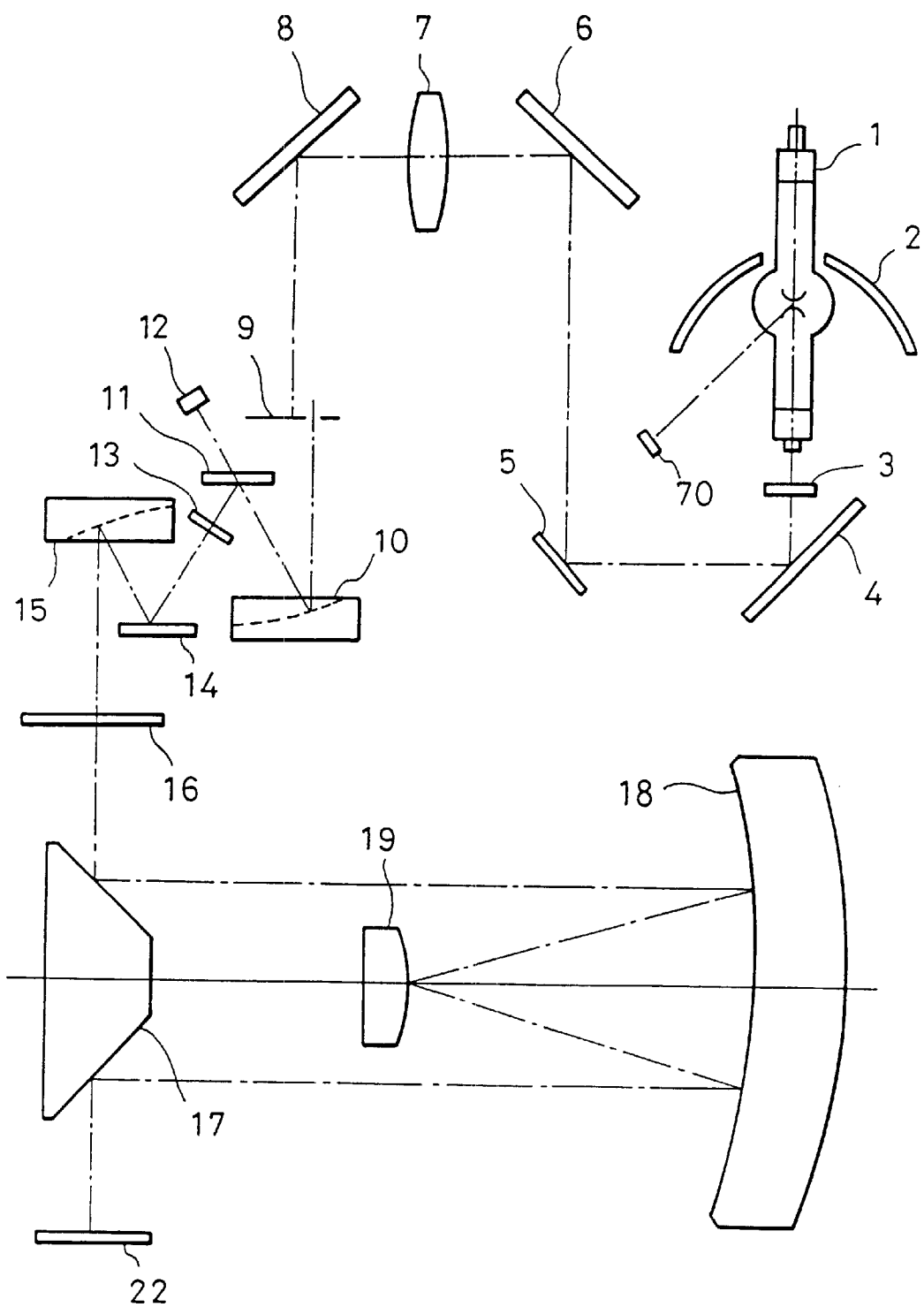
FIGS. 11 and 12 are schematic diagrams respectively illustrating the elements of exposure apparatuses in accordance with modified embodiments of the first to third embodiments of the present invention.
Figure 12:
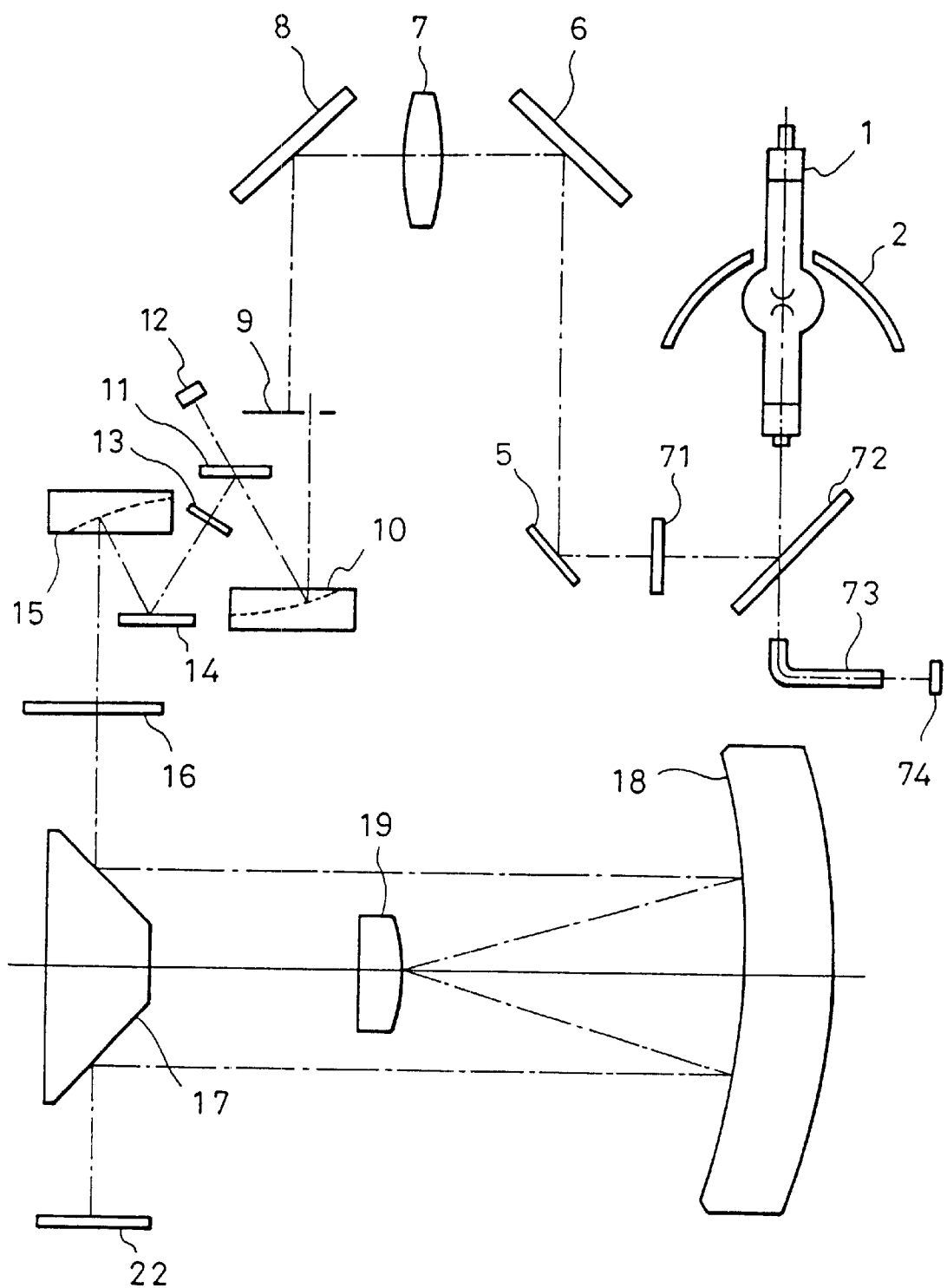

Although, in the above embodiment, constant illuminance control is switched to constant current or constant power holding by closing the second shutter 3, a light quantity monitor sensor 70 may be disposed before the second shutter 3 together with or in place of the light quantity monitor sensor 12, as shown in FIG. 11. In this case, the lighting mode need not be switched. Alternatively, a half mirror 72 may be provided in place of the mirror 4 shown in FIG. 1, and a light quantity monitor sensor 74 may be disposed so as to monitor light through optical fibers 73, as shown in FIG. 12. In this case, a second shutter 71 is provided.

Further, although the maintenance function using a soft timer is employed in the case when the constant power is held for a long time, the indicated power value is actually read by an A/D converter, and a difference in the indicated power value is corrected by periodically switching the control mode to the constant illuminance mode so that the same processing as that performed by using the timer can be made.

Figure 13:
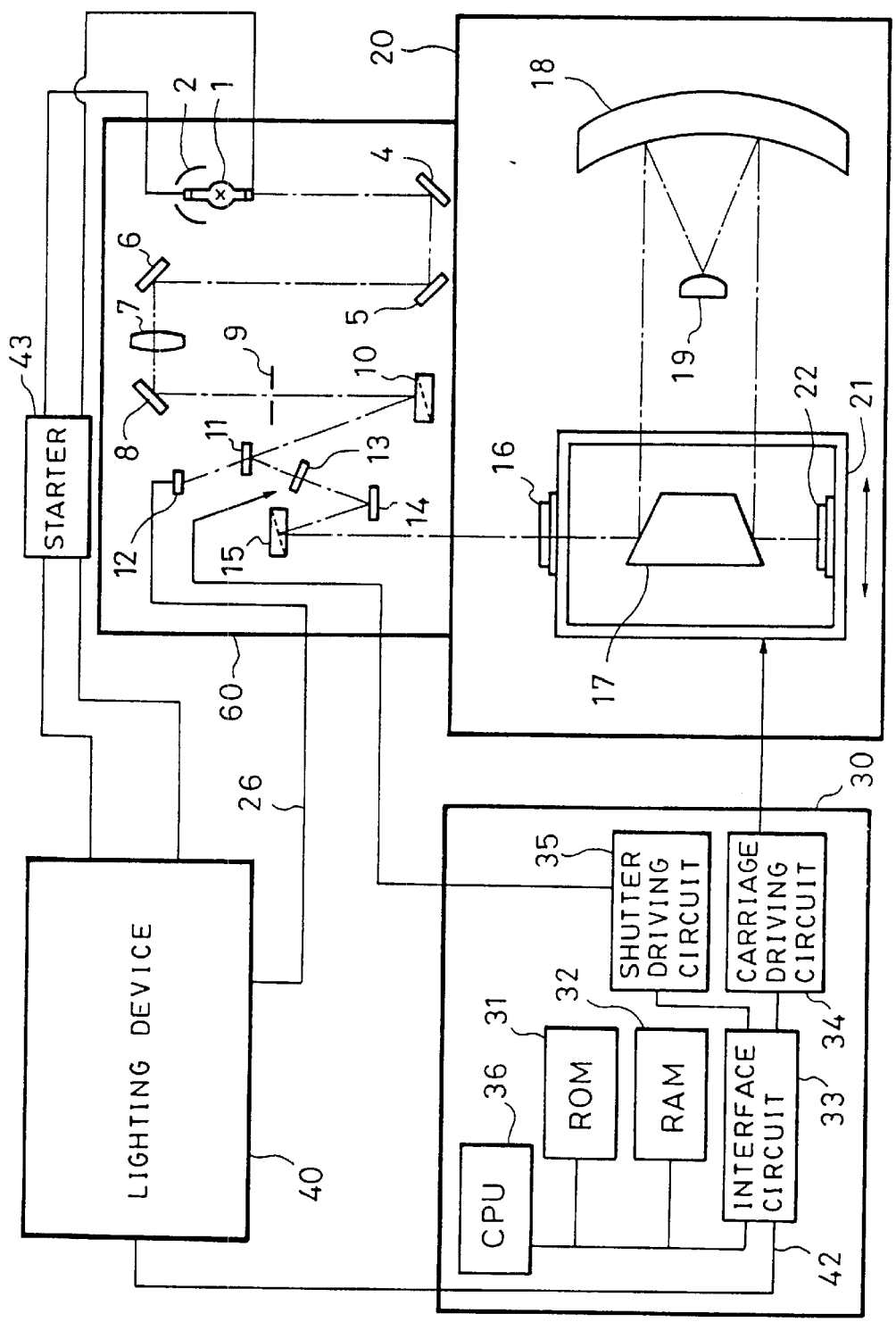
FIG. 13 is a diagram illustrating the construction of a reflection type projection exposure apparatus in accordance with a fourth embodiment of the present invention.

FIG. 13 is a schematic diagram illustrating a reflection type projection exposure apparatus for producing a device in accordance with a fourth embodiment of the present invention. In FIG. 13, reference numeral 60 denotes an illumination optical system having a light source for the exposure apparatus and an illumination system; and reference numeral 20, a body having a mechanism for transferring a device pattern image of a mask to a wafer, an alignment mechanism (not shown) and a projection optical system. Reference numeral 30 denotes a control box comprising a CPU for controlling the sequential operation of the whole exposure apparatus; and reference numeral 40, a lighting device for lighting a super-high pressure mercury lamp 1 serving as the light source for the exposure apparatus and controlling power during lighting. Signal transmission and power supply to each of the units are made through cables.

In the illumination system 60, reference numeral 1 denotes the super-high pressure mercury lamp, and reference numeral 2 denotes a spherical mirror for converging the light emitted from the mercury lamp 1 in the direction of the optical path (shown by one-dot chain lines). The light directly emitted from the mercury lamp 1 and the light reflected once by the spherical mirror 2 travels through the optical path shown by the one-dot chain lines, passed through mirrors 4, 5 and 6, a condenser lens 7 and a mirror 8, and enters a slit 9. The slit 9 extracts effective light used for projection exposure by using the opening thereof to form slit (circular arc) light. The slit light is reflected by a spherical mirror 10, and is divided by a half mirror 11 into a little portion of the light which enters the light quantity monitor sensor 12 used for keeping illuminance constant during constant illuminance control, and a greater portion of the light which enters the exposure control shutter 13. The exposure operation in the apparatus operation sequence is started, the shutter 13 is opened, the slit light is reflected by mirrors 14 and 15, and is directed to the mask 16 disposed on the carriage 21 of the body 20.

Since the mask 16 and the wafer 22 are integrally supported by the carriage 21, the position of the mask 16 and the wafer 22 relative to the slit light applied to the mask 16 is moved when the mask 16 and the wafer 22 are integrally moved by the carriage 21 so that the whole device pattern image of the mask 16 is transferred to the whole surface of the wafer 22. The wafer 22 is then treated to produce a device such as a semiconductor memory, a CCD, a liquid crystal panel, a magnetic head or the like.

The control box 30 comprises a ROM 31 for storing an operational sequence program for the whole apparatus, a central processing unit CPU 36 for calculating the operational sequence program and processing the sequence, a RAM 32 for storing processed data, an interface circuit 33 for inputting and outputting a signal to an actuator (not shown) of each of the units of the apparatus, a carriage driving circuit 34 for driving an actuator (not shown) of the carriage 21 to move the carriage 21, an exposure control shutter 13 and a shutter driving circuit 35.

When the lighting device 40 is actuated, the mercury lamp 1 is lighted through a starter 43 for applying a high voltage thereto. The lighting device 40 has three lighting modes including a mode of lighting the mercury lamp 1 with a constant current, a constant illuminance mode for keeping illuminance constant, and a mode for holding the power supplied immediately before the shutter 13 is closed.

The mercury lamp 1 is in the constant current mode immediately after lighting. In this apparatus, the lighting device 40 must be used in the constant illuminance mode during the exposure operation, as described above with reference to a conventional example. The control mode must be switched to the constant illuminance mode once by a manual operation in order to set a reference value of illuminance. The mode of the mercury lamp 1 is thus switched to the constant illuminance mode by manually operating the console panel of the lighting device 40. In this state, an illuminance meter is set on the apparatus, and a reference value of illuminance is set by operating a dial mounted on the console panel of the lighting device 40.

In this embodiment, the mercury lamp 1 is lighted in a constant illuminance mode during the exposure operation and the operation of measuring illuminance, and is lighted in the constant power mode of holding the power supplied in the exposure operation and the operation of measuring illuminance in other sequential operations. This increases the time interval of power increase and thus retards deterioration in the super-high pressure mercury lamp 1, as compared with the case when the constant illuminance mode is continuously performed.

Figure 14:
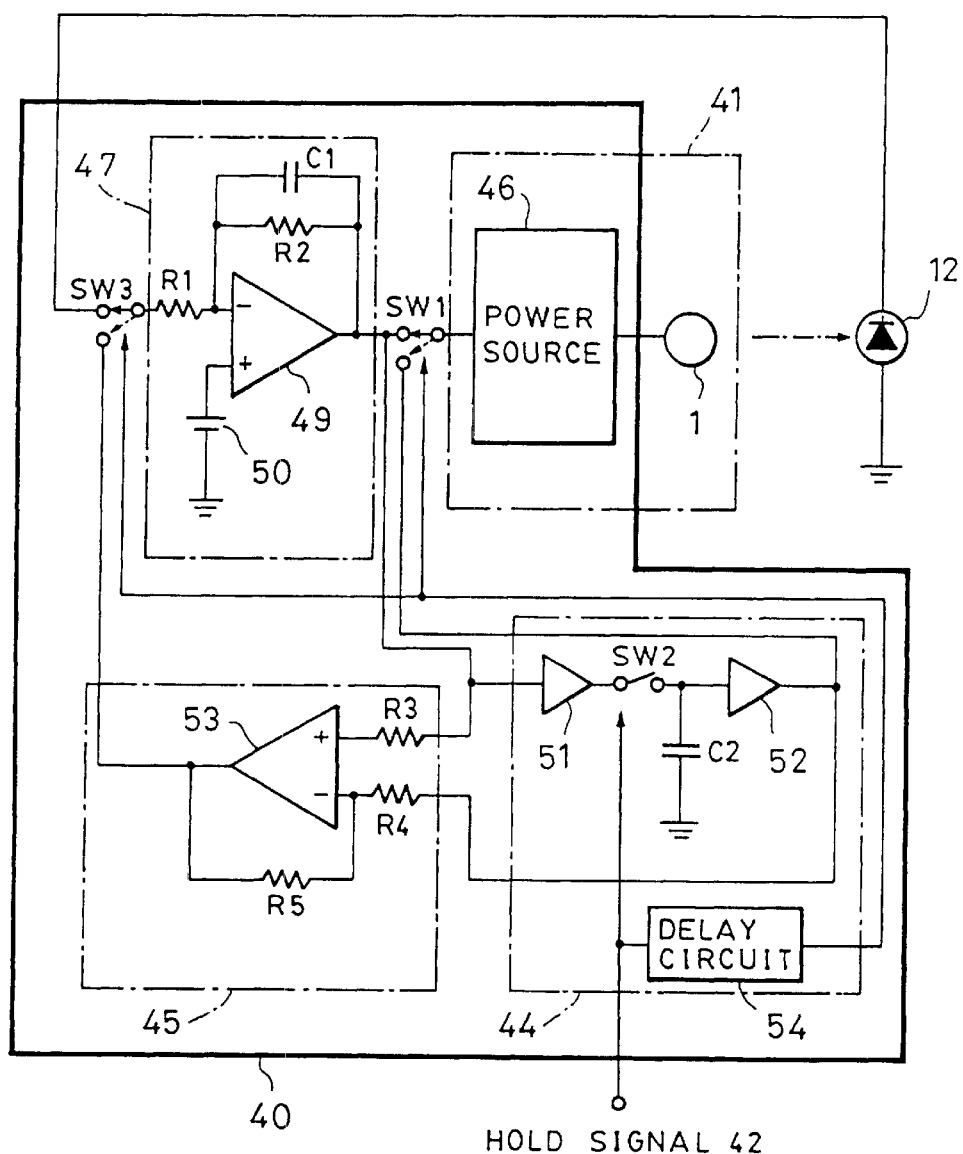
FIG. 14 is a diagram illustrating the circuit of a principal portion of a lighting device of the exposure apparatus shown in FIG. 13 for explaining the operation of maintaining electric power.

FIG. 14 is a diagram showing the circuit used in this embodiment. The circuit comprises a controlled section 41 comprising a power source 46 and a light source 1, a detector 12 comprising a photodiode for detecting the optical output of the super-high pressure mercury lamp 1 which is the output of the controlled section 41, a first error amplifier 47 for comparing the detected output signal of the detector 12 with the reference voltage of the reference power source 50 to output an error signal, a holding circuit 44, and a second error amplifier 45. Reference numeral 49 denotes an operational amplifier, and reference numeral 50 denotes the reference power source. Reference numerals 51 and 52 each denote a buffer amplifier, reference numeral 53 denotes an operational amplifier, and reference numeral 54 denotes a delay circuit for delaying the hold signal 42. Reference numerals R1 to R5 each denote a resistor; reference numerals C1 and C2, a capacitor; and reference numerals SW1 and SW3, a change-over switch. Reference numeral SW2 denotes a sampling switch.

The first error amplifier 47 comprises the operational amplifier 49, the reference power source 50, the resistors R1 and R2, and the capacitor C1. The second error amplifier 45 comprises the operational amplifier 53, and the resistors R3 to R5. The holding circuit 44 comprises the buffer amplifiers 51 and 52, the capacitor C2 and the sampling switch SW2. The sampling switch SW2 is operated by the hold signal. Each of the change-over switches SW1 and SW3 is controlled in conjunction with a command value switching signal obtained by delaying the hold signal 42 and output from the delay circuit 54.

When the hold signal 42 input to the holding circuit 44 is turned off, each of the change-over switches SW1 and SW3 is switched to a position shown by a solid line with an arrow by a command value switching signal which indicates hold-off. In the state wherein each of the change-over switches SW1 and SW3 is switched to the position shown by the solid line with the arrow, the super-high pressure mercury lamp 1 is controlled with constant power by a feed back loop. When the hold signal is turned on, since each of the change-over switches SW1 and SW3 is switched from the position shown by the solid line with the arrow to the position shown by the dotted line with the arrow, the output of the holding circuit 44 is input to the first error amplifier 47. The output signal from the first error amplifier 47 is thus maintained at a value specified by the hold output signal from the holding circuit 44.

Figure 15:
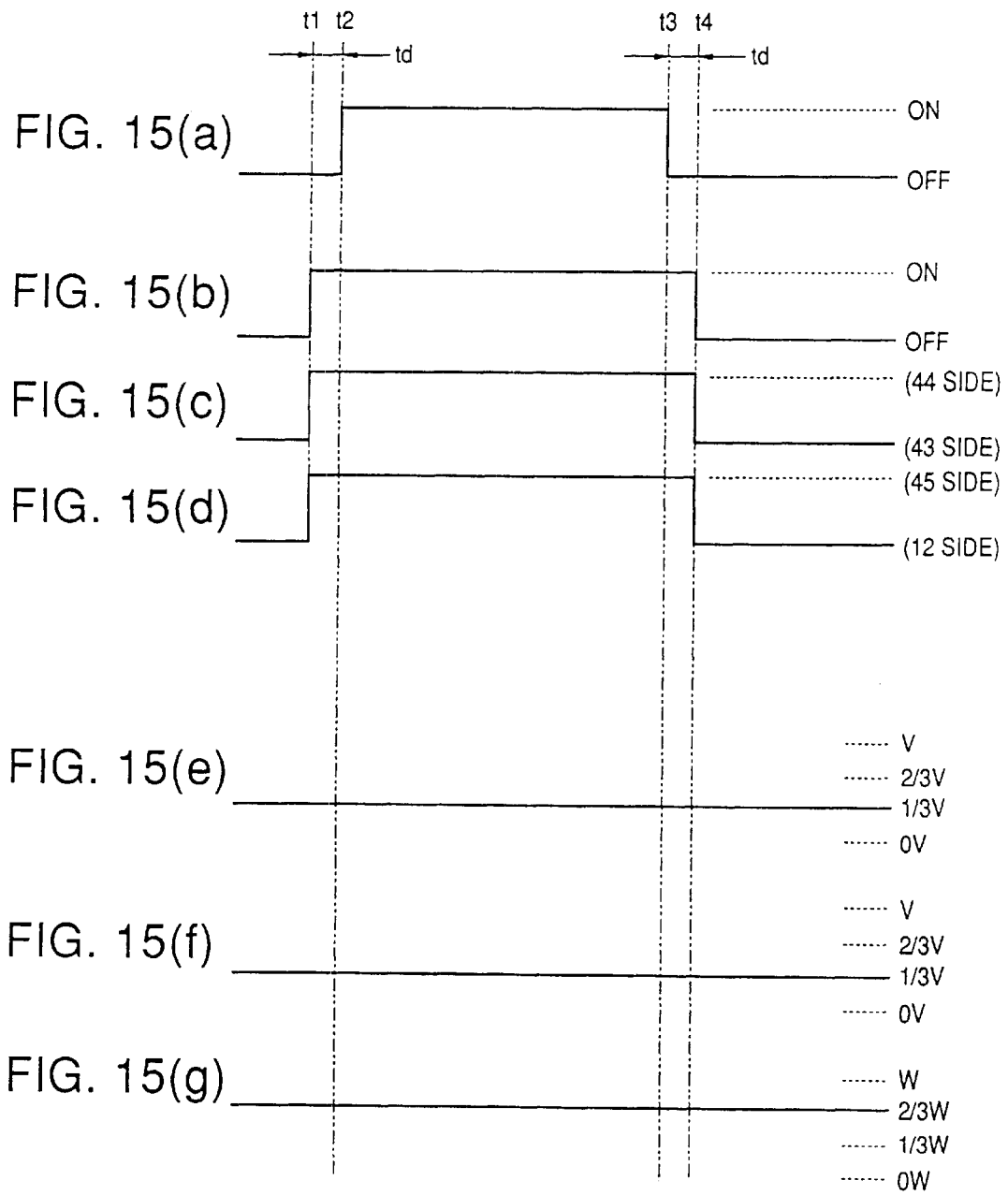
FIGS. 15(a) to 15(g) are diagrams explaining the operation of maintaining electric power when a mode is switched between constant illuminance and power holding operation modes by opening and closing a second shutter in the exposure apparatus shown in FIG. 13.

FIGS. 15(a) to 15(g) are diagrams explaining the power or current holding operation in this embodiment. FIG. 15(a) denotes turning on and off of the hold signal 42; FIG. 15(b), the hold state; FIG. 15(c), the switching operation of the change-over switch SW1; FIG. 15(d), the switching operation of the change-over switch SW3; FIG. 15(e), the output signal of the first error amplifier; FIG. 15(f), the input signal of the power source 46; and FIG. 15(g), the power supplied to the super-high pressure mercury lamp 1.

The sampling switch SW2 is operated by the hold signal at time t1 so that the output signal of the first error amplifier 47 is held by the capacitor C1. The change-over switch SW1 is switched from the side of the first error amplifier 47 to the side of the hold circuit 44, as shown by FIG. 15(c). The change-over switch SW3 is switched from the side of the detector 12 to the side of the second error amplifier 45, as shown by FIG. 15(d).

When the hold signal is then turned on at time t2, the output signal of the second error amplifier 45 is input to the first error amplifier 47. Since, in the second error amplifier 45, the hold output signal of the holding circuit 44 is input to the (−) terminal of the operational amplifier 53 through the resistor R4, and the output signal from the first error amplifier 47 is input to the (+) terminal of the operational amplifier 53 through the resistor R3, the output signal from the second error amplifier 45 is input as a value corresponding to the hold output signal of the holding circuit 44, and the output signal from the first error amplifier 47 is maintained at the value of the signal output immediately before the hold signal is turned on. Namely, for example, an output signal of ($\frac{1}{3}$) V is maintained, as shown by FIG. 15(e).

When the hold signal is turned off at time t3, since each of the change-over switches SW1 and SW3 remains switched to the position shown by the dotted line with the arrow for time td from the time t3, the output signal from the first error amplifier 47 maintains the previous state. When each of the change-over switches SW1 and SW3 is switched from the position shown by the dotted line with the arrow to the position shown by the solid line with the arrow at time t4, the output signal from the first error amplifier 47 maintains the value of the signal output before the hold signal is turned on. When the illuminance of the super-high pressure mercury lamp 1 is constant, the output signal from the first error amplifier 47 is also constant, as shown by a solid line in FIG. 15(e). Therefore, the signal input to the power source is also constant, as shown by a solid line in FIG. 15(f), and the power supplied to the super-high pressure mercury lamp 1 is maintained at a constant value of, for example, ($\frac{2}{3}$) W, as shown by FIG. 15(g).

Figure 16:
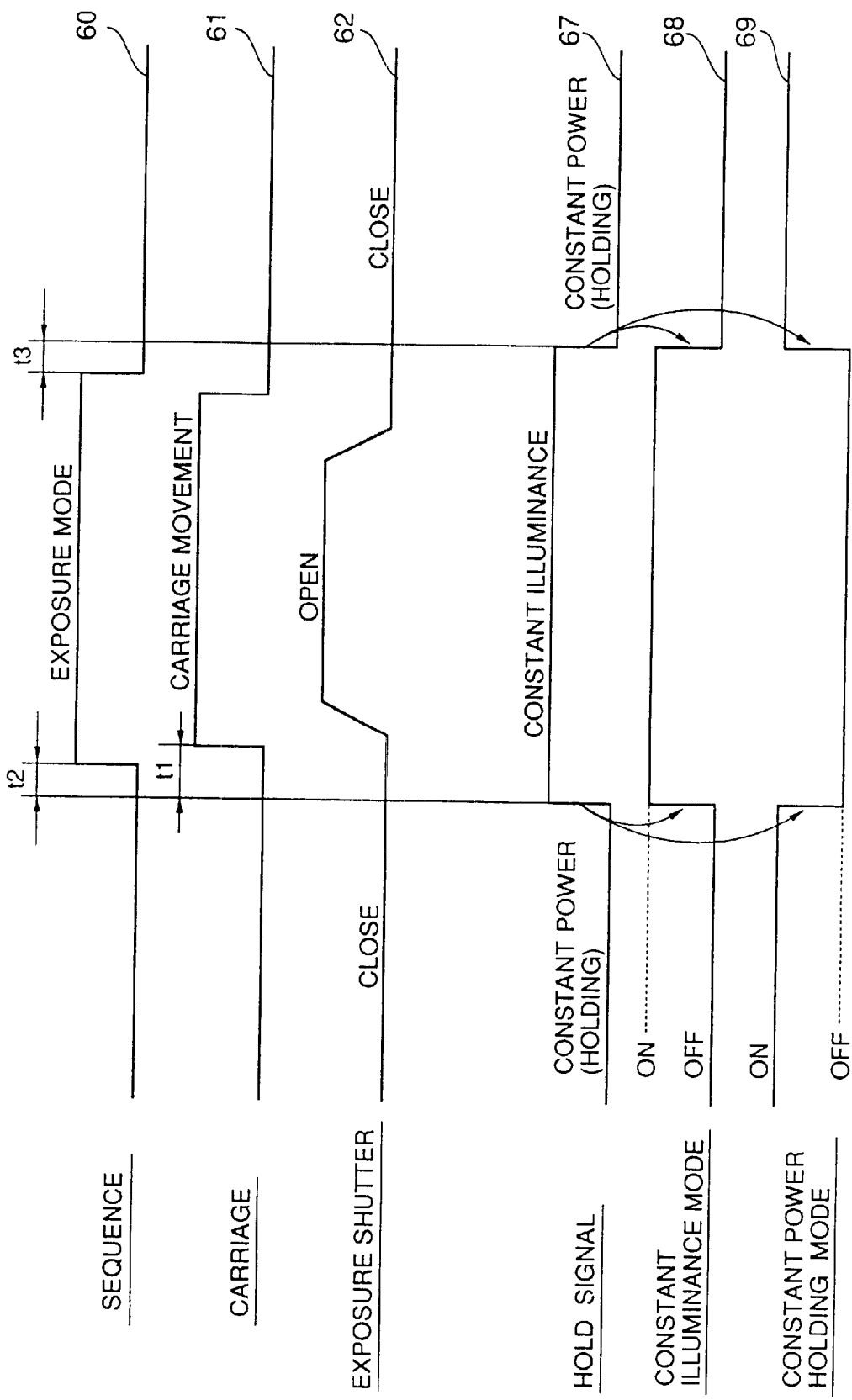
FIG. 16 is a timing chart showing an exposure sequence and the switching timing of control modes of a mercury lamp in the exposure apparatus shown in FIG. 13.
Figure 17:
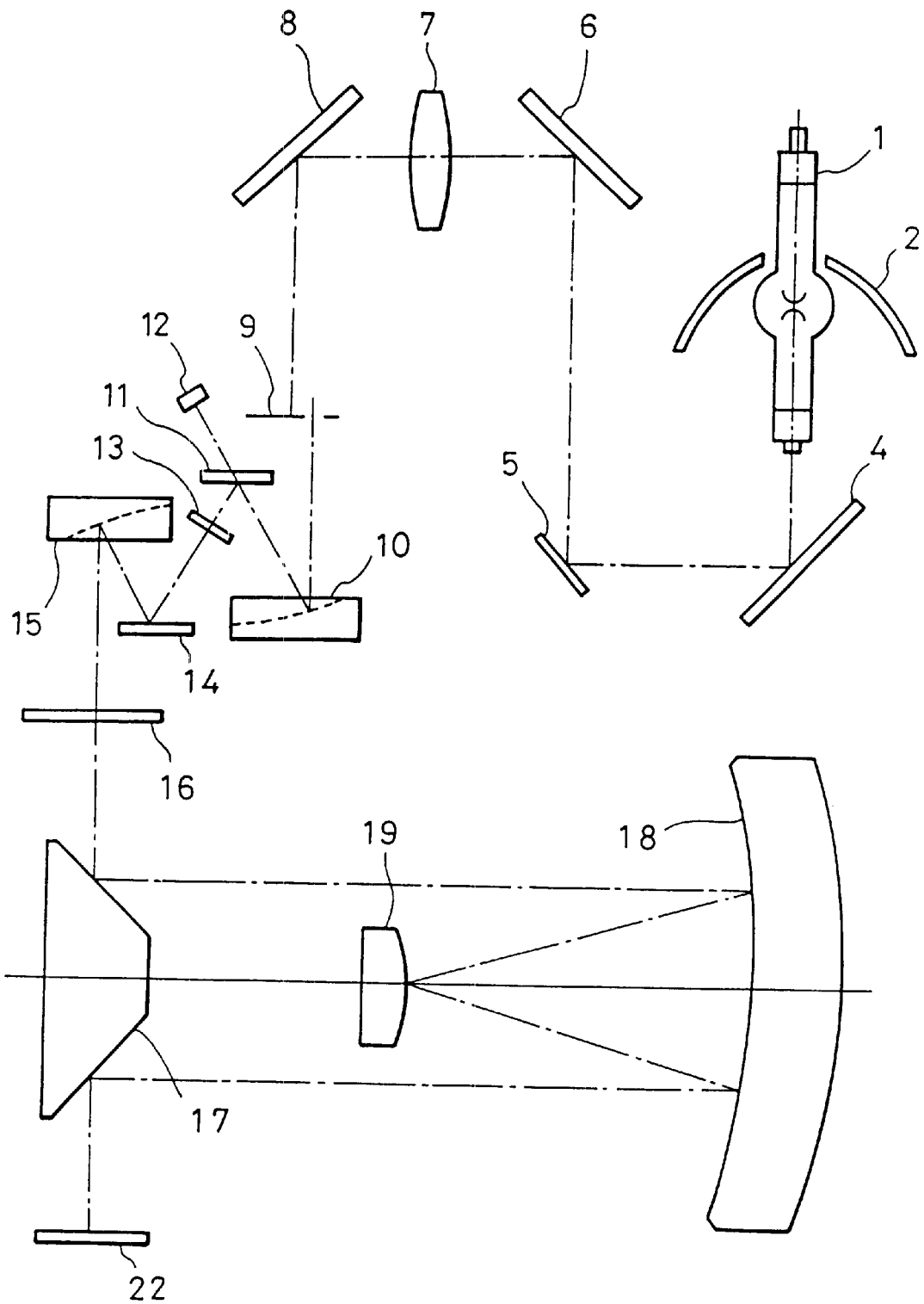
FIG. 17 is a diagram illustrating a conventional reflection type projection exposure apparatus.

FIG. 16 is a diagram showing the opening and closing operation of the exposure shutter 13 before and after the exposure sequence in the operational sequence of the apparatus, and the timing of switching between the constant illuminance mode and the constant power holding mode in conjunction with the opening and closing operation. In FIG. 16, reference numeral 60 denotes the exposure sequence; reference numeral 61, the movement of the carriage for scanning exposure; and reference numeral 62, the timing of opening and closing of the exposure shutter. Reference numeral 67 denotes a signal which indicates the timing of switching between the constant illuminance mode and the constant power holding mode and which corresponds to the hold signal 42 input to the lighting device 40 from the interface circuit 33. Reference numeral 68 denotes the operation timing of the constant illuminance mode, and reference numeral 69 denotes the operation timing of the constant power holding mode.

When the constant power holding mode of the three control modes of the mercury lamp 1 is turned on, as shown on the left of the timing chart 69 in FIG. 16, lighting of the mercury lamp 1 is controlled independently of the signal from the light quantity monitor sensor 12. The hold signal shown by the timing chart 67 is switched t1 seconds before the exposure sequence is started so that the change in the light mode is transmitted to the lighting device 40 through the signal 42. When the lighting device 40 receives the signal 42, the control mode is automatically switched from the constant power holding mode to the constant illuminance mode. Since the illuminance in the constant illuminance mode is different from that in the constant power holding mode, the carriage movement sequence is started after the elapse of time t2 over the response time on switching.

In the exposure operation, the carriage 21 shown in FIG. 13 is moved to a position on the right of the drawing where no light is applied to the mask 16 and the wafer 22. The exposure shutter 13 is then opened with the timing 62 before the carriage 21 is moved to the left of the drawing, and the mask 16 and the wafer 22 are then scanned and exposed at a constant speed. After the mask 16 and the wafer 22 are exposed, the exposure control shutter 13 is closed. The hold signal shown by the timing chart 67 is changed after the exposure sequence is completed (after t3 seconds) so that the lighting control mode is switched again to the constant power holding mode. The operational sequence is then repeated.

This embodiment can prevent a continuous increase in the power of the lamp 1 and thus prevent deterioration in the electrode of the mercury lamp 1, thereby increasing the life of the mercury lamp 1. The constant voltage holding mode or the constant current holding mode may be used in place of the constant power holding mode.

Although, in this embodiment, the constant illuminance mode is used in the exposure sequence of the apparatus and in measurement of illuminance (or exposure), and the constant power, constant current or constant voltage mode is used in other operations, the idle state of the apparatus may be detected so that the constant illuminance mode is used when the wafer is present in the apparatus or cassette, i.e., when the apparatus is actually operated, and the constant power, constant current or constant voltage mode is used when the wafer 22 is absent, i.e., when the apparatus is idle.

Figure 18:
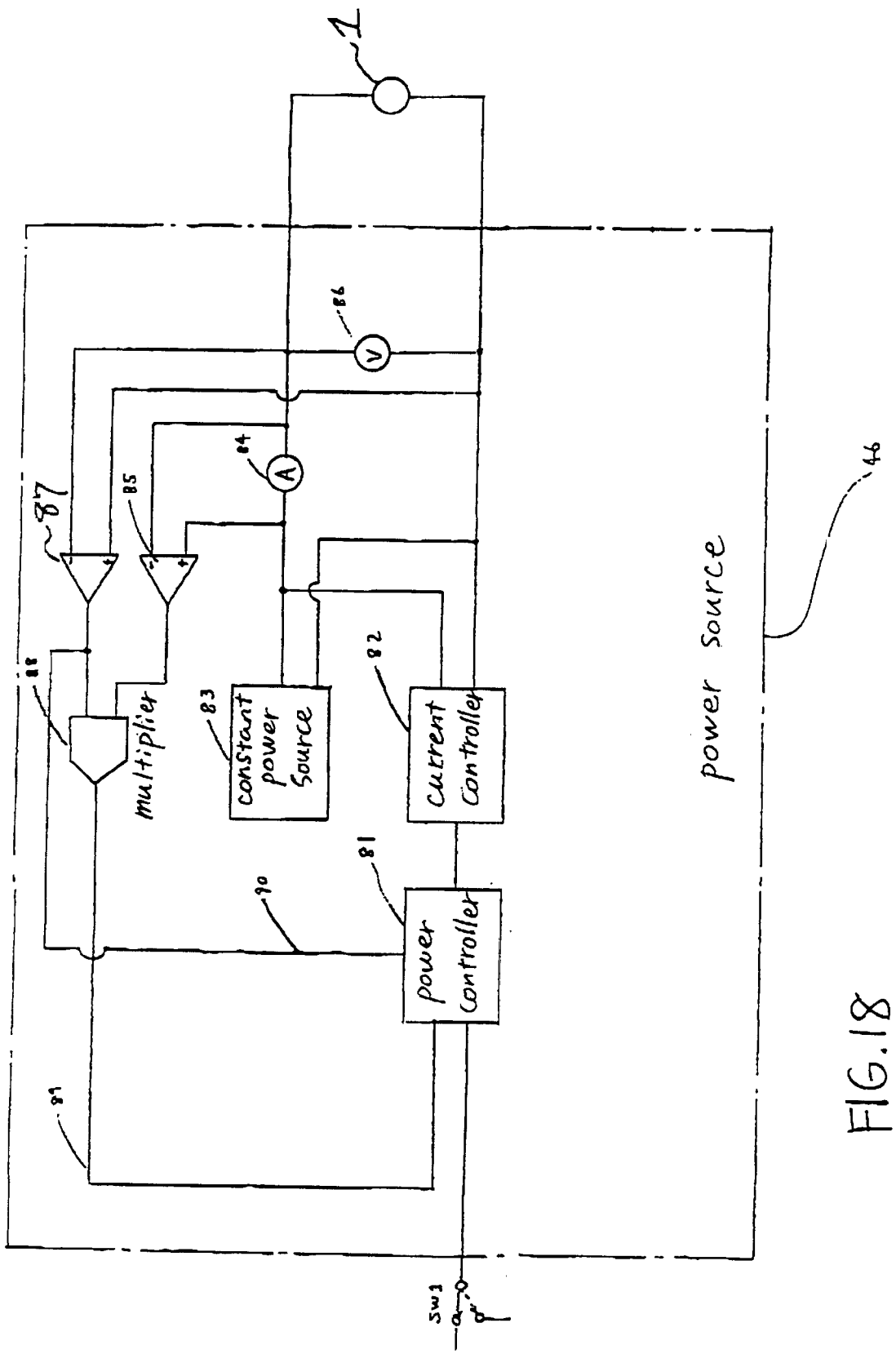
FIG. 18 illustrates an example of a circuit for power source 46 shown in FIGS. 3 and 14.

In FIG. 18, reference numeral 81 denotes a power controller for controlling the power to keep it at a constant value on the basis of a command value (set value) and reference numeral 82, a current controller for controlling the current of lamp 1 on the basis of a control signal from the power controller 81 so that the current can be increased or decreased. Reference numeral 83 denotes a constant voltage power source for applying a voltage which is higher than a lamp voltage to the lamp 1, reference numeral 84, an ammeter for detecting a lamp current, and reference numeral 85, a current detection amplifier for converting the current detected by the ammeter 84 into a voltage and amplifying it in order to form a voltage signal for feed-back. Reference numeral 86 denotes a voltmeter for detecting a lamp voltage and reference numeral 87, a voltage detection amplifier for amplifying the voltage detected by the voltmeter 86 to form a voltage signal for feed-back. Reference numeral 88 denotes a multiplier for multiplying the voltage signal from the current detection amplifier 85, by the voltage signal from the voltage detection amplifier 87, in order to form a voltage signal for power feed-back, reference numeral 89, a signal line for inputting the power feed-back signal from the multiplier 88 into the power controller 81 and reference numeral 90, a signal line for inputting the voltage signal from the current detection amplifier 87 into the power controller 81.

The power controller 81 compares the power command value and the power feed-back signal, and sends the control signal to the current controller so that both values agree with each other. The power controller 81 controls the current controller 82 on the basis of the voltage signal from the current detection amplifier 87, when the lamp voltage varies during the control of the constant power.

Figure 19:
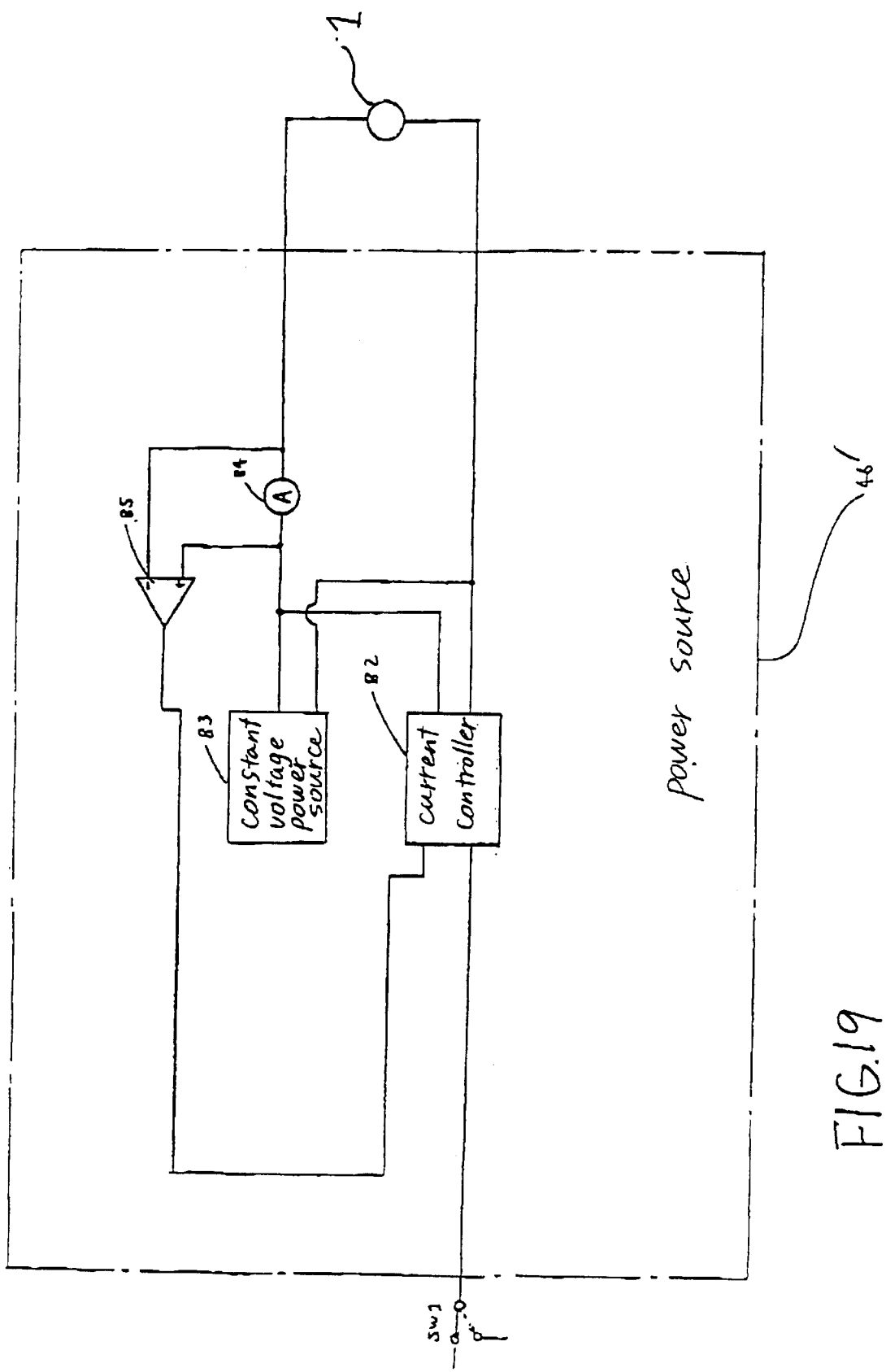
FIG. 19 illustrates an example of a circuit for power source 46' for driving lamp 1 with a constant current.

In FIG. 19, reference numeral 82 denotes a current controller for controlling the current of the lamp 1 to keep it at a constant value on the basis of the current command value (set value), and reference numeral 83, a current voltage power source for applying a voltage which is higher than the lamp voltage to the lamp 1. Reference numeral 84 denotes an ammeter for detecting the lamp current and reference numeral 85, a current detection amplifier for converting the current detected by the ammeter 84 to a voltage and amplifying it in order to generate a voltage signal as a current feed-back signal.

The current controller 82 compares the current command value and the current feed-back signal and sends the current to the lamp 1 so that both values agree with each other.

Except as other wise disclosed herein, the various components shown in outline or in block form in the figures are individually well-known in their internal construction and operation and are not critical either to the making or using of this invention or to a description of the best mode of the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus comprising:
   a light source for supplying an exposure beam along an exposure beam path;
   an optical system for receiving the exposure beam;
   a first shutter for opening and closing the exposure beam path, provided downstream of said optical system in the exposure beam path; and
   a second shutter for opening and closing the exposure beam path, provided upstream of said optical system in the exposure beam path, said second shutter being opened before said first shutter is opened and being closed after said first shutter is closed, wherein the exposure beam passes through said second shutter and subsequently through said first shutter.

2. An exposure apparatus according to claim 1, further comprising a beam splitter provided between said optical system and said first shutter to extract a portion of the exposure beam, a photodetector for receiving a portion of the exposure beam and for detecting the intensity of the portion of the exposure beam received by said photodetector, and driving means for driving said light source to minimize any change in an output of said photodetector when said second shutter is open.

3. An exposure apparatus according to claim 2, further comprising scanning means for simultaneously moving, relative to the exposure beam, (i) a mask having a pattern, which is illuminated by the exposure beam, and (ii) a substrate, which is exposed to the exposure beam through the pattern.

4. An exposure apparatus according to claim 3, wherein said driving means drives said light source to minimize any change in a voltage for driving said light source when said second shutter is closed.

5. An exposure apparatus according to claim 3, wherein said driving means drives said light source to minimize any change in a current for driving said light source when said second shutter is closed.

6. An exposure apparatus according to claim 3, wherein said driving means drives said light source to minimize any change in power for driving said light source when said second shutter is closed.

7. An exposure apparatus according to claim 3, wherein said driving means drives said light source to minimize any change from a power supplied immediately before said second shutter is closed to a power that is supplied when said second shutter is closed.

8. An exposure apparatus according to claim 3, wherein said driving means drives said light source to minimize any change from a voltage supplied immediately before said second shutter is closed to a voltage that is supplied when said second shutter is closed.

9. An exposure apparatus according to claim 3, wherein said driving means drives said light source to minimize any change from a current supplied immediately before said second shutter is closed to a current that is supplied when said second shutter is closed.

10. An exposure apparatus according to claim 3, wherein said driving means comprises means for opening and closing said second shutter, after a predetermined time has passed since said first shutter is closed.

11. An exposure apparatus comprising:

a light source for supplying an exposure beam along an exposure beam path;

an optical system for receiving the exposure beam;

a first shutter operable only in a closed position and only in an open position to block the exposure beam path in the closed position and to unblock the exposure beam path in the open position, provided downstream of said optical system in the exposure beam path;

a second shutter for opening and closing the exposure beam path, provided upstream of said optical system in the exposure beam path, said second shutter being opened before said first shutter is shifted from its closed position to its open position and a photodetector for detecting the intensity of a part of the exposure beam extracted in the beam path between said first shutter and said second shutter, wherein the exposure beam passes through said second shutter and subsequently through said first shutter shifted to its open position.

12. An exposure apparatus according to claim 11, further comprising driving means for driving said light source to maintain an output of said photodetector substantially constant when said second shutter is open.

13. An exposure apparatus according to claim 11, wherein said optical system leads the exposure beam to a mask on which a pattern is formed, and further comprising projecting means for projecting the pattern to a substrate.

14. An illumination apparatus comprising:

an optical system for receiving an illumination beam along an illumination beam path;

a first shutter, operable only in a closed position and only in an open position to block the illumination beam path in the closed position and to unblock the illumination beam path in the open position, provided downstream of said optical system in the illumination beam path; and a second shutter for opening and closing the illumination beam path, provided upstream of said optical system in the illumination beam path, said second shutter being opened before said first shutter is shifted from its closed position to its open position, wherein the illumination beam passes through said second shutter and subsequently through said first shutter shifted to its open position.

15. An exposure apparatus comprising:

a light source for supplying an exposure beam along an exposure beam path;

an optical system for receiving the exposure beam;

a first shutter for opening and closing the exposure beam path, provided downstream of said optical system in the exposure beam path; and a second shutter for opening and closing the exposure beam path, provided upstream of said optical system in the exposure beam path, said second shutter being opened before said first shutter is opened and being closed after said first shutter is closed; and a photodetector for detecting the intensity of a part of the exposure beam extracted in the beam path between said first shutter and said second shutter, wherein the exposure beam passes through said second shutter and subsequently through said first shutter.

16. An exposure apparatus according to claim 15, further comprising driving means for driving said light source to minimize and change in an output of said photodetector when said second shutter is open.

17. An exposure apparatus according to claim 15, wherein said optical system leads the exposure beam to a mask on which a pattern is formed, and further comprising projecting means for projecting the pattern to a substrate.

18. An illumination apparatus comprising:

an optical system for receiving an illumination beam along an illumination beam path;

a first shutter for opening and closing the illumination beam path, provided downstream of said optical system in the illumination beam path; and a second shutter for opening and closing the illumination beam path, provided upstream of said optical system in the illumination beam path, said second shutter being opened before said first shutter is opened and being closed after said first shutter is closed, wherein the illumination beam passes through said second shutter and subsequently through said first shutter.

* * * * *

UNITED STATES PATENT AND TRADEMARK OFFICE
CERTIFICATE OF CORRECTION

PATENT NO. : 6,400,444 B2
DATED : June 4, 2002
INVENTOR(S) : Suzuki

It is certified that error appears in the above-identified patent and that said Letters Patent is hereby corrected as shown below:

Drawings,
Sheet 16 of 17 and sheet 17 of 17, corrected FIG. 18 and corrected FIG. 19, should be substitute for the corresponding drawing sheets as shown below:

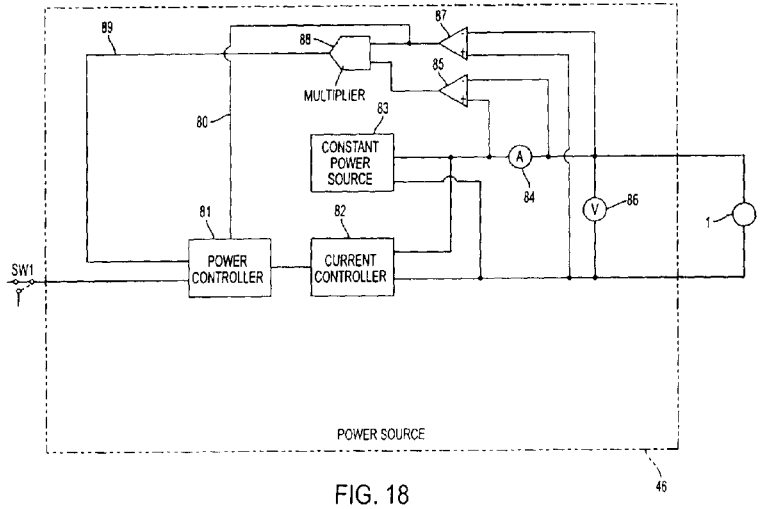

FIG. 18

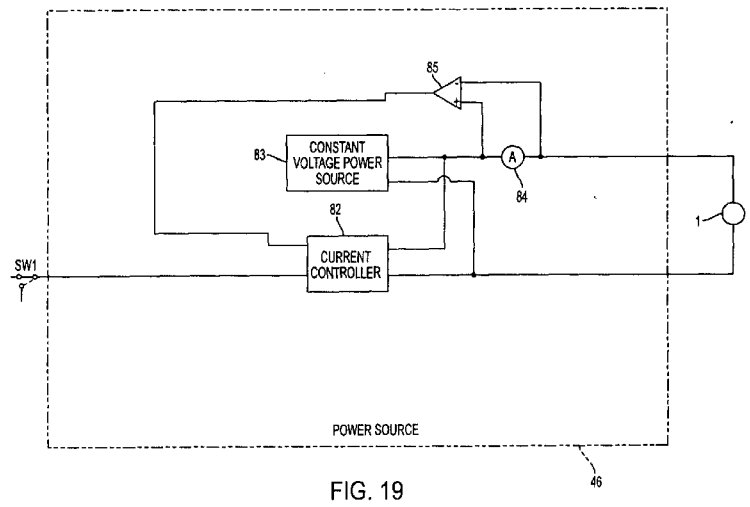

FIG. 19

Column 3,
Line 1, "he" should read -- the --.
Line 66, "with" should read -- with the --.

UNITED STATES PATENT AND TRADEMARK OFFICE
CERTIFICATE OF CORRECTION

PATENT NO. : 6,400,444 B2
DATED : June 4, 2002
INVENTOR(S) : Suzuki

It is certified that error appears in the above-identified patent and that said Letters Patent is hereby corrected as shown below:

Column 5,
Line 61, "when." should read -- when --.

Column 6,
Line 58, "from by" should read -- from --.

Column 7,
Lines 14 and 17, "an" should read -- a --.

Column 11,
Line 46, "operation" should read -- operations --.
Line 51, "operation." should read -- operations. --.

Column 13,
Line 1, "Level" should read -- level --.

Column 16,
Line 37, "operation." should read -- operations. --.

Column 18,
Line 9, "other wise" should read -- otherwise --.

Column 19,
Line 34, "position and" should read -- position; and --.

Signed and Sealed this

Twelfth Day of November, 2002

*Attest:*

JAMES E. ROGAN
*Attesting Officer* *Director of the United States Patent and Trademark Office*